(12) United States Patent
Ichikawa et al.

(10) Patent No.: US 10,037,591 B2
(45) Date of Patent: Jul. 31, 2018

(54) INFORMATION PROCESSING APPARATUS AND METHOD OF CONTROLLING THE SAME

(71) Applicant: CANON KABUSHIKI KAISHA, Tokyo (JP)

(72) Inventors: Masanori Ichikawa, Tokyo (JP); Tomohiro Tachikawa, Tokyo (JP); Shigeki Hasui, Tokyo (JP); Noboru Yokoyama, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 93 days.

(21) Appl. No.: 15/000,947

(22) Filed: Jan. 19, 2016

(65) Prior Publication Data
US 2016/0224385 A1 Aug. 4, 2016

(30) Foreign Application Priority Data

Jan. 29, 2015 (JP) ................. 2015-016085

(51) Int. Cl.
*G06T 1/20* (2006.01)
*G06F 17/50* (2006.01)

(52) U.S. Cl.
CPC ............ *G06T 1/20* (2013.01); *G06F 17/5054* (2013.01)

(58) Field of Classification Search
None
See application file for complete search history.

(56) References Cited

U.S. PATENT DOCUMENTS

| 6,160,560 A * | 12/2000 | Keller ................. G06T 1/20 |
| | | 345/503 |
| 2005/0038975 A1* | 2/2005 | Hudepohl ............ G06F 9/3836 |
| | | 712/34 |
| 2009/0204826 A1* | 8/2009 | Cox ..................... G06F 1/3203 |
| | | 713/320 |
| 2013/0346979 A1* | 12/2013 | Nightingale ............ G06F 8/456 |
| | | 718/100 |
| 2013/0346985 A1* | 12/2013 | Nightingale ........ G06F 15/7871 |
| | | 718/102 |
| 2015/0046486 A1* | 2/2015 | Asaad ............... G06F 17/30442 |
| | | 707/765 |

FOREIGN PATENT DOCUMENTS

JP      2013-098823 A     5/2013

* cited by examiner

*Primary Examiner* — Meng Ai T An
*Assistant Examiner* — Michael W Ayers
(74) *Attorney, Agent, or Firm* — Fitzpatrick, Cella, Harper & Scinto

(57) ABSTRACT

An information processing apparatus that processes a job, the apparatus comprises: a programmable circuit unit configured to configure a logic circuit; and a processing unit configured to process the job in accordance with a job processing request, wherein the processing unit selects, in accordance with a state of the programmable circuit unit, whether to process the job by using the programmable circuit unit being configuring a logic circuit corresponding to the job, or to process the job without using the programmable circuit unit.

18 Claims, 23 Drawing Sheets

| | |
|---|---|
| CIRCUIT CONFIGURATION INFORMATION A | ~401 |
| CIRCUIT CONFIGURATION INFORMATION B | ~402 |
| CIRCUIT CONFIGURATION INFORMATION C | ~403 |
| ⋮ | |

400

500

| ENTRY No | PROCESSING CONTENT |
|---|---|
| 1 | PROCESS A |
| 2 | PROCESS B |
| 3 | PROCESS C |
| ⋮ | ⋮ |

FIG. 6

| PROCESSING UNIT RESOURCE | FPGA 202 | CPU 106 | CPU 204 |
|---|---|---|---|
| AVAILABILITY STATUS | ○ | ○ | ○ |

○ :UNUSED  × :IN USE

FIG. 7

| PROCESSING CONFIGURATION | NECESSARY PROCESSING UNITS | | |
|---|---|---|---|
| | FPGA 202 | CPU 106 | CPU 204 |
| PROCESSING CONFIGURATION A | ○ | ○ | × |
| PROCESSING CONFIGURATION B | ○ | × | ○ |
| PROCESSING CONFIGURATION C | × | ○ | × |
| PROCESSING CONFIGURATION D | × | × | ○ |

○ :NECESSARY  × :UNNECESSARY

FIG. 8A

| PRIORITY | PROCESSING CONFIGURATION |
|---|---|
| 1 | PROCESSING CONFIGURATION A |
| 2 | PROCESSING CONFIGURATION B |
| 3 | PROCESSING CONFIGURATION C |
| 4 | PROCESSING CONFIGURATION D |

PROCESSING CONFIGURATION MANAGEMENT TABLE OF PROCESS A

FIG. 8B

| PRIORITY | PROCESSING CONFIGURATION |
|---|---|
| 1 | PROCESSING CONFIGURATION B |
| 2 | PROCESSING CONFIGURATION D |

PROCESSING CONFIGURATION MANAGEMENT TABLE OF PROCESS B

FIG. 8C

| PRIORITY | PROCESSING CONFIGURATION |
|---|---|
| 1 | PROCESSING CONFIGURATION A |
| 2 | PROCESSING CONFIGURATION B |

PROCESSING CONFIGURATION MANAGEMENT TABLE OF PROCESS C

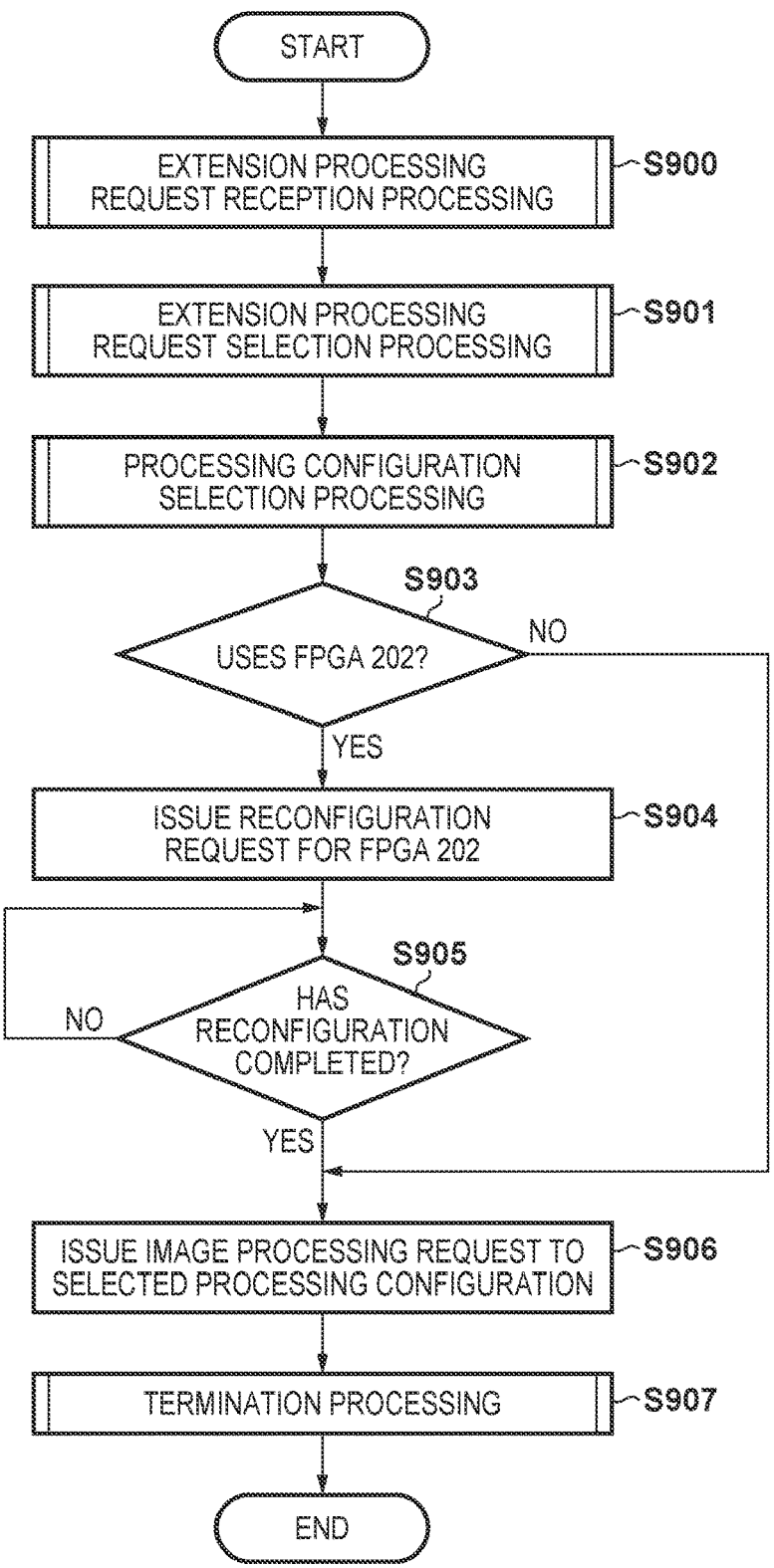

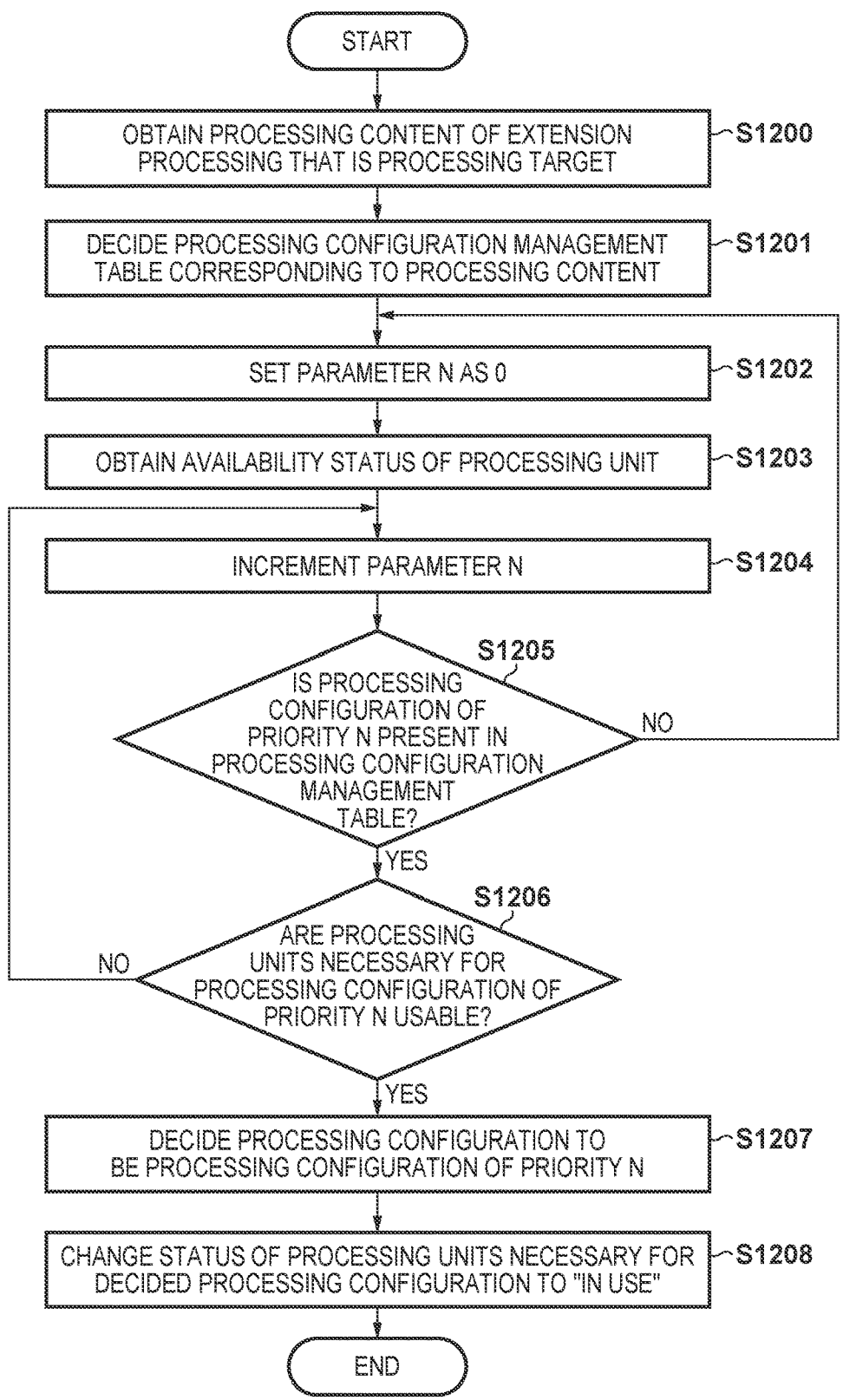

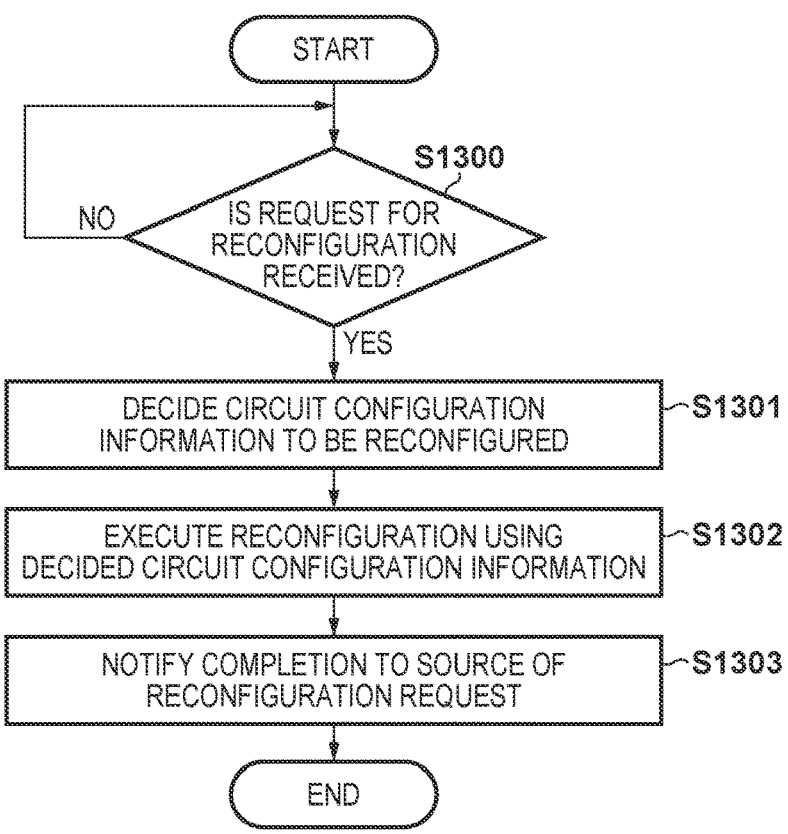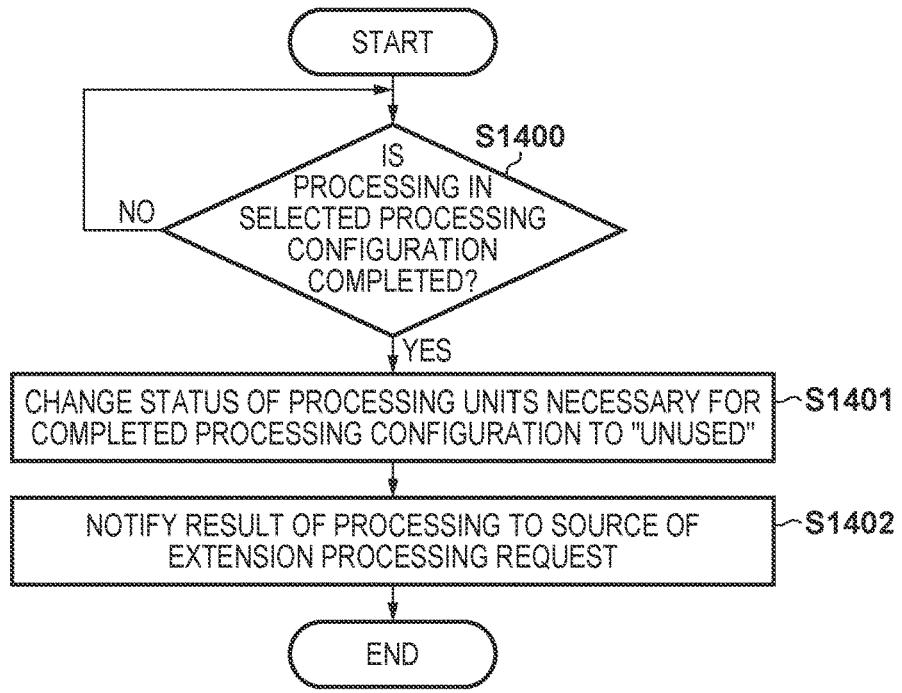

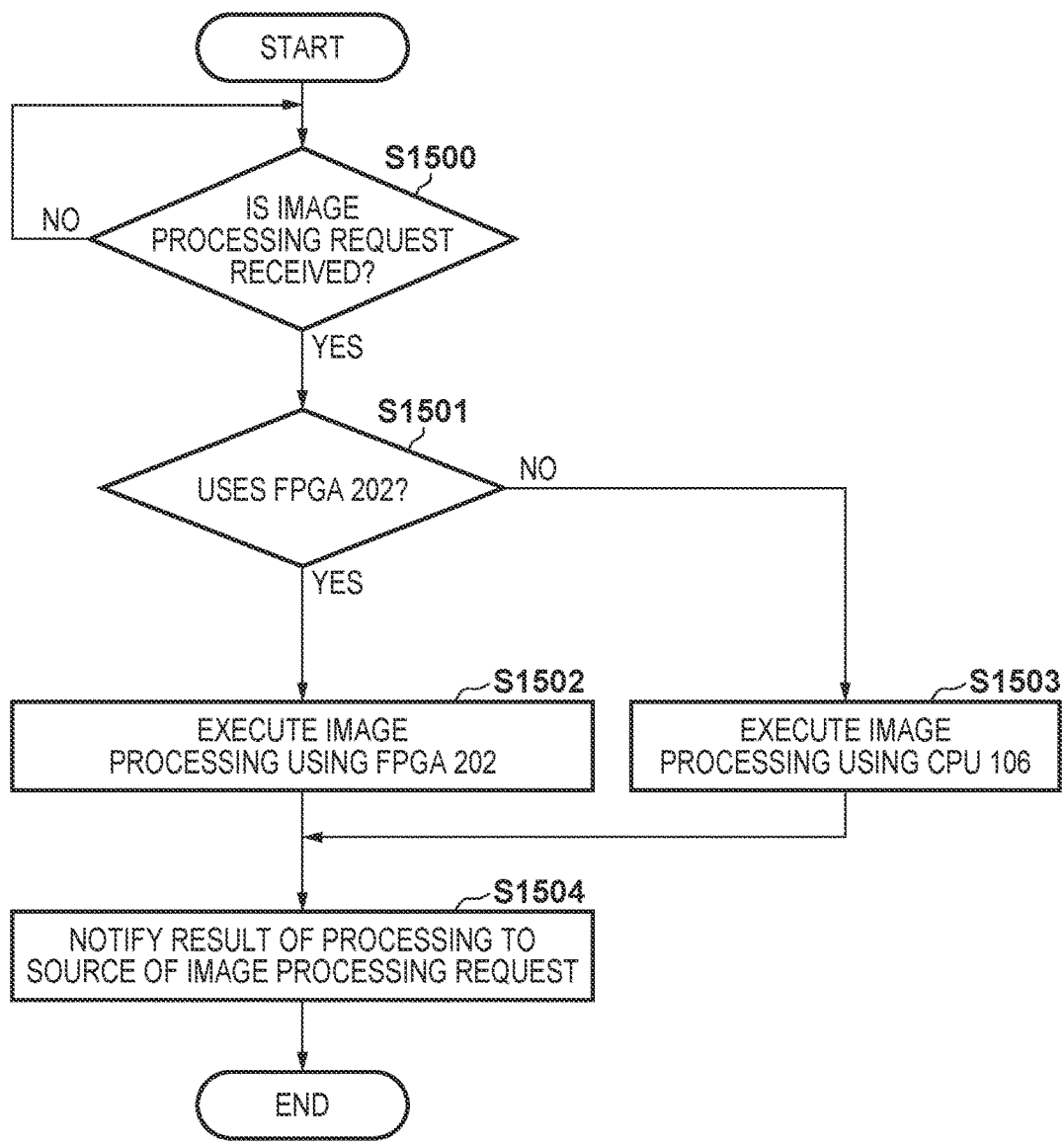

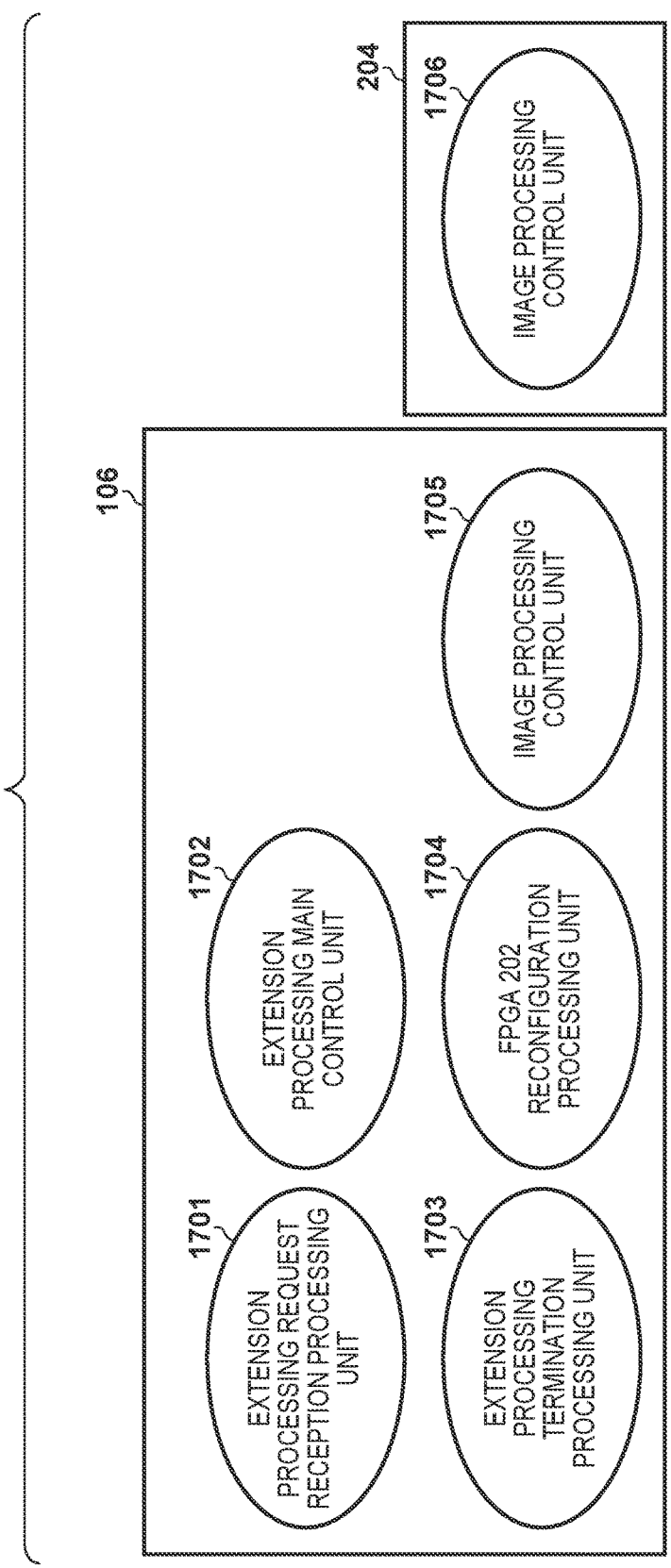

| JOB NAME | PROCESS | PROCESSING UNIT | PROCESSING ORDER | STATE |
|---|---|---|---|---|
| PRINT 1 | PDL RECEPTION | NW COMMUNICATION UNIT | 1 | TERMINATED |
|  | PDL INTERPRET | CPU | 2 | TERMINATED |
|  | RIP | RIP | 3 | TERMINATED |
|  | PRINT IMAGE PROCESSING | PRINTER IMAGE PROCESSING UNIT | 4 | CURRENTLY BEING PROCESSED |
|  | PRINT OUTPUT | DEVICE IF (PRINT) | 5 | NOT YET |

1810

| JOB NAME | PROCESS | PROCESSING UNIT | PROCESSING ORDER | STATE |
|---|---|---|---|---|
| PRINT 2 | PDL RECEPTION | NW COMMUNICATION UNIT | 1 | TERMINATED |
|  | PDL INTERPRET | CPU | 2 | TERMINATED |
|  | RIP | RIP | 3 | TERMINATED |
|  | EXTENSION PRINT PROCESSING | EXTENSION PROCESSING UNIT | 4 | NOT YET |
|  | PRINT IMAGE PROCESSING | PRINTER IMAGE PROCESSING UNIT | 5 | NOT YET |
|  | PRINT OUTPUT | DEVICE IF (PRINT) | 6 | NOT YET |

1820

| JOB NAME | PROCESS | PROCESSING UNIT | PROCESSING ORDER | STATE |
|---|---|---|---|---|
| PUSH SCAN 1 | SCAN DATA RECEPTION | DEVICE IF (SCAN) | 1 | TERMINATED |
|  | SCAN IMAGE PROCESSING | SCANNER IMAGE PROCESSING UNIT | 2 | TERMINATED |
|  | EXTENSION SCAN PROCESSING | EXTENSION PROCESSING UNIT | 3 | NOT YET |
|  | PDF CONVERSION | CPU | 4 | NOT YET |
|  | PDF OUTPUT | NW COMMUNICATION UNIT | 5 | NOT YET |

FIG. 20

| | SETTING |
|---|---|
| "PRIORITIZE POWER" OR "PRIORITIZE PERFORMANCE" | PRIORITIZE POWER |

| | SETTING |
|---|---|
| POWER STATE (NORMAL OR POWER SAVING) | POWER SAVING |

| PROCESSING CONFIGURATIONS | NECESSARY PROCESSING UNITS | | | USAGE POSSIBLE/ NOT POSSIBLE WHEN POWER SAVING |
|---|---|---|---|---|
| | FPGA 202 | CPU 106 | CPU 204 | |
| PROCESSING CONFIGURATION A | ○ | ○ | × | × |
| PROCESSING CONFIGURATION B | ○ | × | ○ | × |
| PROCESSING CONFIGURATION C | × | ○ | × | ○ |
| PROCESSING CONFIGURATION D | × | × | ○ | × |

○: POSSIBLE    ×: NOT POSSIBLE

INFORMATION PROCESSING APPARATUS AND METHOD OF CONTROLLING THE SAME

BACKGROUND OF THE INVENTION

Field of the Invention

The present invention relates to an information processing apparatus comprising a programmable logic device and a method of controlling the same.

Description of the Related Art

In Japanese Patent Laid-Open No. 2013-098823, as an FPGA (Field Programmable Gate Array) configuration method, a method that is different to a method of loading configuration data from a ROM (Read Only Memory) is illustrated. Specifically, it is a method of loading configuration data from an HDD (Hard Disk Drive) into an FPGA where a CPU (Central Processing Unit) is made to be a master device. Hereinafter this method will be referred to as "a CPU master configuration" By using a CPU master configuration, it becomes possible to update FPGA processing content by replacing a file in an HDD to load without rewriting a ROM. In this way, because any FPGA can be rewritten from the CPU, it is possible to increase the number of types of processes (jobs) that an FPGA can execute more conveniently than before.

There are FPGAs that are equipped with multiple high speed ports (for example, PCI Express) that the CPU can connect to. 2 or more CPUs share this kind of FPGA, and it becomes possible to allow an acceleration of processing by each CPU using a logic circuit comprised in the FPGA. Assume that in such an FPGA-sharing configuration, a CPU accepts a job for which a shortening in processing time by using the FPGA can be expected, for example. Here, when another CPU is using the FPGA already, conventionally, the first CPU would wait for usage to become possible by the other CPU completing its usage of the FPGA. However, depending on the content of the job that the first CPU is to execute, there are cases where not waiting for the FPGA to become usable and rather executing the job itself without using the FPGA would lead to a shortening in the processing time.

SUMMARY OF THE INVENTION

The present invention proposes a method for selecting an appropriate processing configuration that will not reduce processing performance when selecting a process from a plurality of processing configurations in a system having an FPGA that is shared by a plurality of CPUs.

According to one aspect of the present invention, there is provided an information processing apparatus that processes a job, the apparatus comprising: a programmable circuit unit configured to configure a logic circuit; and a processing unit configured to process the job in accordance with a job processing request, wherein the processing unit selects, in accordance with a state of the programmable circuit unit, whether to process the job by using the programmable circuit unit being configuring a logic circuit corresponding to the job, or to process the job without using the programmable circuit unit.

According to another aspect of the present invention, there is provided an information processing apparatus including a first processing unit, a second processing unit, and a programmable circuit unit of which reconfiguration is possible by rewriting circuit information, the apparatus comprising: a holding unit configured to hold definition information that defines, for each type of processes, a processing configuration that can execute processing by a combination that includes at least one of the first processing unit, the second processing unit, and the programmable circuit unit; a managing unit configured to manage a usage condition of the first processing unit, the second processing unit, and the programmable circuit unit; a receiving unit configured to receive a request for a process; a selection unit configured to select, based on the definition information and the usage condition of each of units managed by the managing unit, a processing configuration that can execute the process for which the receiving unit received; and a control unit configured to cause the process for which the receiving unit received to execute, by using the processing configuration selected by the selection unit.

According to another aspect of the present invention, there is provided a method of controlling an information processing apparatus that includes: a first processing unit; a second processing unit; a programmable circuit unit for which reconfiguration is possible by rewriting circuit information; and a holding unit configured to hold, for each type of processes, definition information defining a processing configuration that can execute processing by a combination that includes at least one of the first processing unit, the second processing unit, and the programmable circuit unit, the method comprising: managing a usage condition of the first processing unit, the second processing unit, and the programmable circuit unit; receiving a request for a process; selecting, based on the definition information and the usage condition of each of units managed by the managing, a processing configuration that can execute the process of the receiving; and causing the process of the receiving to execute, by using the selected processing configuration.

According to the present invention it becomes possible to select an appropriate processing configuration that will not reduce processing performance when selecting a processing configuration from a plurality of processing configurations in a system having an FPGA that is shared by a plurality of CPUs.

Further features of the present invention will become apparent from the following description of exemplary embodiments (with reference to the attached drawings).

BRIEF DESCRIPTION OF THE DRAWINGS

FIG. 6 is a view for illustrating an example configuration of a processing unit availability status management table in accordance with the first embodiment.

FIG. 7 is a view for illustrating an example configuration a processing configuration table in accordance with the first embodiment.

FIGS. 8A, 8B and 8C are views for illustrating example configurations of processing configuration management tables in accordance with the first embodiment.

FIG. 9 is a flowchart for extension processing control processing in accordance with the first embodiment.

FIG. 12 is a flowchart for processing configuration selection processing in accordance with the first embodiment.

FIG. 13 is a flowchart for FPGA reconfiguration processing in accordance with the first embodiment.

FIG. 14 is a flowchart for extension processing control termination processing in accordance with the first embodiment.

FIG. 15 is a flowchart for image processing control processing in accordance with the first embodiment.

FIG. 17 is a view for illustrating an example of a software configuration in accordance with the first embodiment.

FIG. 18 is a view for illustrating an example configuration of a table for managing a processing state of a job in accordance with a second embodiment.

FIG. 20 is a view for illustrating an example of priority setting information in accordance with a third embodiment.

FIG. 21 is a view for illustrating an example of power state information in accordance with a third embodiment.

FIG. 22 is a view for illustrating an example configuration of a processing configuration table in accordance with the third embodiment.

DESCRIPTION OF THE EMBODIMENTS

<First Embodiment>

Figure 1:
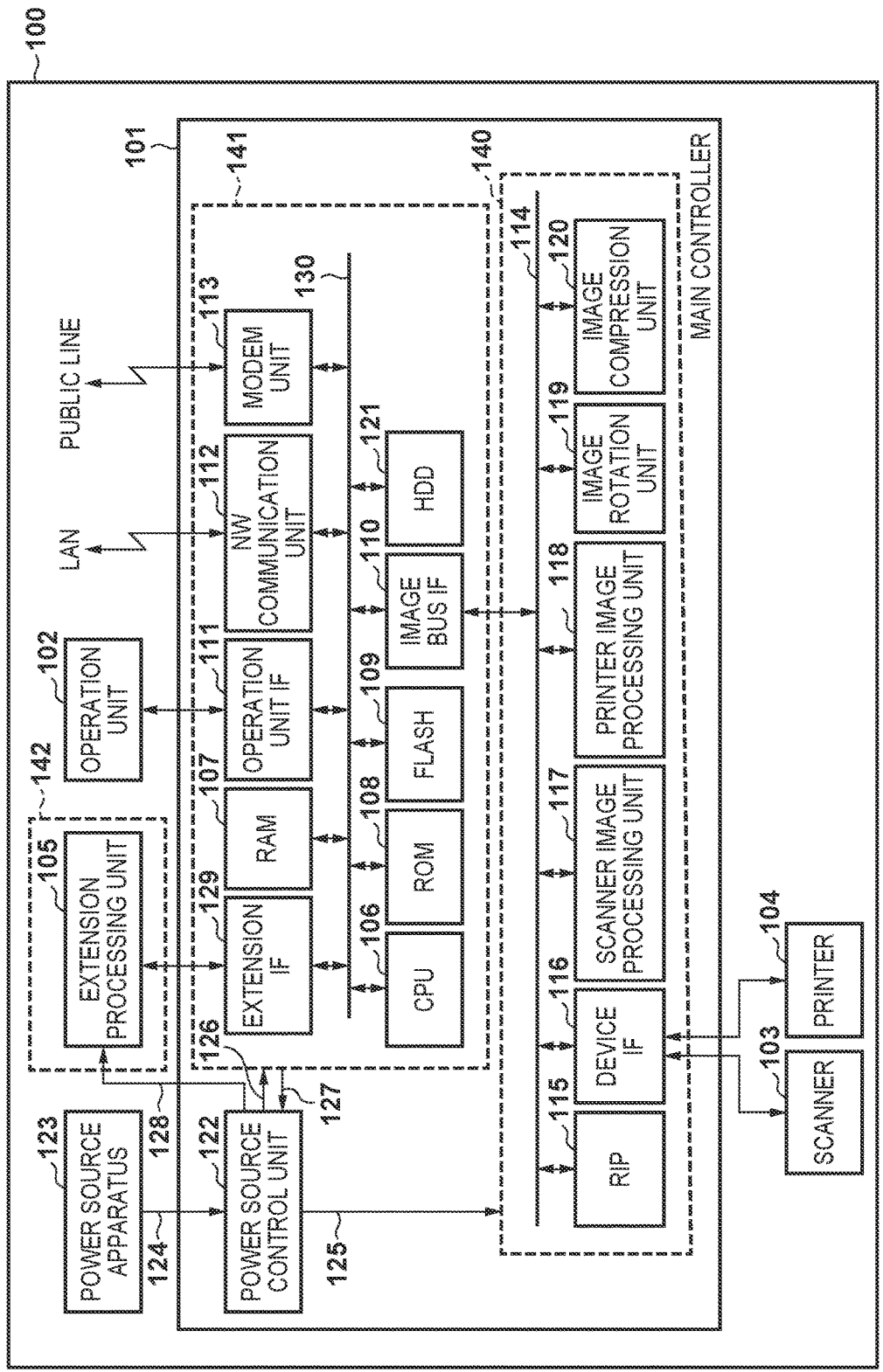
FIG. 1 is a view for illustrating an example configuration of an image forming apparatus in accordance with a first embodiment.

Below, with reference to the drawings, detailed explanation is given of embodiments in accordance with the present invention. Note that the same reference numerals are given to portions having the same function in the drawings, and overlapping explanation will be omitted as appropriate.

[Device Configuration]

Using FIG. 1, an overall configuration of an image forming apparatus which is an information processing apparatus in accordance with a first embodiment of the present invention will be explained. In the present embodiment, an image forming apparatus 100 is a multi function peripheral (MFP: Multi Function Peripheral) that inputs/outputs, or transmits/receives images, and performs various image processing in relation thereto. The image forming apparatus 100 comprises a main controller 101, an operation unit 102 which is a user interface, a scanner 103 which is an image input device, and a printer 104 which is an image output device. The operation unit 102, the scanner 103, and the printer 104 are each connected to the main controller 101, and the main controller 101 controls operation of each unit. Also, the image forming apparatus 100 connects with an extension processing unit 105 through an extension IF 129 that the main controller 101 comprises. The main controller 101 comprises a CPU 106 which is responsible for primary control. The CPU 106 is connected via a system bus 130 with a RAM (Random Access Memory) 107, a ROM 108, and a Flash (Flash memory) 109. Furthermore, the CPU 106 is connected to an image bus IF 110, an operation unit IF 111, an NW communication unit 112, a modem unit 113, and the extension IF 129.

The RAM 107 is memory that can be read or written as necessary and that provides a work area as a main storage unit of the CPU 106, and the RAM 107 is used as an image memory for temporarily storing image data that is internally processed. The ROM 108 is a boot ROM, and a boot program necessary for a system activation, and various processing programs necessary for operation are stored therein. The Flash 109 is a non-volatile memory, and system software, setting value data or the like that needs to be held after a power disconnection of the image forming apparatus 100 are stored therein.

The operation unit IF 111 is an interface for performing input/output with the operation unit 102 which is comprised by a liquid crystal touch panel, or the like, for example. The operation unit IF 111 outputs image data to be displayed to the operation unit 102; the operation unit IF 111 is also used for transmitting information that a user inputs via the operation unit 102 to the CPU 106. The NW communication unit 112 is an interface for connecting with a LAN (Local Area Network), and performs input/output of information with respect to the LAN. The modem unit 113 is an interface for connecting with a public line, and performs input/output of information with respect to the public line. The image bus IF 110 is an interface for connecting the system bus 130 and an image bus 114 which is for transferring image data, and the image bus IF 110 operates as a bus bridge for converting a data structure.

To the image bus 114, an RIP (Raster Image Processor) 115, a device IF 116, a scanner image processing unit 117, a printer image processing unit 118, an image rotation unit 119, and an image compression unit 120 are connected. The RIP 115 expands PDL (Page Description Language) data into a bitmap image. The device IF 116 is an interface connecting the scanner 103 and the printer 104 to the main controller 101, and the device IF 116 performs a conversion between a synchronous system and an asynchronous system for image data. The scanner image processing unit 117 performs image processing such as correction, processing, editing, or the like, on input image data read from the scanner 103. The printer image processing unit 118 performs processing such as color conversion, filter processing, resolution conversion, or the like on printed output image data that is output to the printer 104. The image rotation unit 119 performs rotation processing of image data. The image compression unit 120 performs JPEG (Joint Photographic Experts Group) compression/decompression processing on multi-valued image data. Also, the image compression unit 120 performs compression/decompression processing using an encoding scheme such as JBIG (Joint Bi-level Image Experts Group), MMR (Modified Modified READ), MH (Modified Huffman), or the like, on binary image data.

An HDD (Hard Disk Drive) 121 is a non-volatile data storage apparatus, and various data such as image data, system data, user data, and operation programs that the CPU 106 executes, or the like are held therein. Circuit information or a control program of an option board comprising an FPGA that is connected as the extension processing unit 105 is included in this. In the case of a configuration in which the main controller 101 is not connected to the HDD 121, various data may be held in the Flash 109.

The extension IF 129 is an interface for a peripheral device connection that is configured by PCI Express, USB (Universal Serial Bus) or the like for example, and the extension IF 129 performs data transmission/reception with connected peripheral devices. In the present embodiment, the extension IF 129 is connected to the extension processing unit 105. Also, a power supply to the extension processing unit 105 is performed through a power supply line 128. The extension processing unit 105 is described later in detail.

A power source control unit 122 supplies a DC power source received via a power supply line 124 from a power source apparatus 123 which is a power supply unit to circuit elements 140 and 141 of the main controller 101 via power supply lines 125 and 126. Also, the power source control unit 122 performs a supply of power to the extension processing unit 105 via the power supply line 128. The power source control unit 122 performs a power supply control by switching a power supply configuration in accordance with a power state of the image forming apparatus 100. Also, the power source control unit 122 receives control signals, via a control signal line 127, from the operation unit IF 111, the NW communication unit 112, the modem unit 113, and the CPU 106. The power source control unit 122 performs a power supply control for each power supply line based on the received control signals.

The power supply line 125 is connected to the circuit element 140 which includes the RIP 115, the device IF 116, the scanner image processing unit 117, the printer image processing unit 118, the image rotation unit 119, and the image compression unit 120. The power supply line 126 is connected to the circuit element 141 which includes the CPU 106, the ROM 108, the RAM 107, the image bus IF 110, the operation unit IF 111, the NW communication unit 112, the modem unit 113, the HDD 121, and the extension IF 129. The power supply line 128 performs a power supply to a circuit element 142 which is connected to the extension IF 129.

In the present embodiment, the image forming apparatus 100 comprises 2 operational states: a normal state and a power saving state. In the normal state, the power source apparatus 123 performs a power supply to the power source control unit 122 via the power supply line 124. Here, the power source apparatus 123 can provide a full power capacity (for example, 1400 watts) used in the normal state by using a large capacity power source circuit and a small capacity power source circuit together. Also, the CPU 106 controls the power source control unit 122 so that the power supply becomes activated for the power supply line 125, the power supply line 126 and the power supply line 128.

In the power saving state, the power source apparatus 123 performs a power supply to the power source control unit 122 via the power supply line 124. Here, the power source apparatus 123 can provide a power capacity (for example, 30 watts) used in the power saving state by using the small capacity power source circuit. Also, the CPU 106 controls the power source control unit 122 so that the power supply becomes inactivated for the power supply line 125 and the power supply line 128, and the power supply becomes activated for the power supply line 126. Here, the power supply is disconnected for the circuit element 142 and the circuit element 140 which comprise functions for which usage in the power saving state is not envisioned, and the power consumption of the main controller 101 can be reduced to less than in the normal state. Meanwhile, the power supply of the power supply line 126 is activated in the power saving state, and the various elements that configure the circuit element 141 can operate similarly to in the normal state.

Note that explanation is given for an example in which there are operational states relating to power control here, but limitation is not made this, and more detailed power states may be comprised. For a specific embodiment related to the power control of the present invention, explanation is given in a third embodiment.

Figure 2:
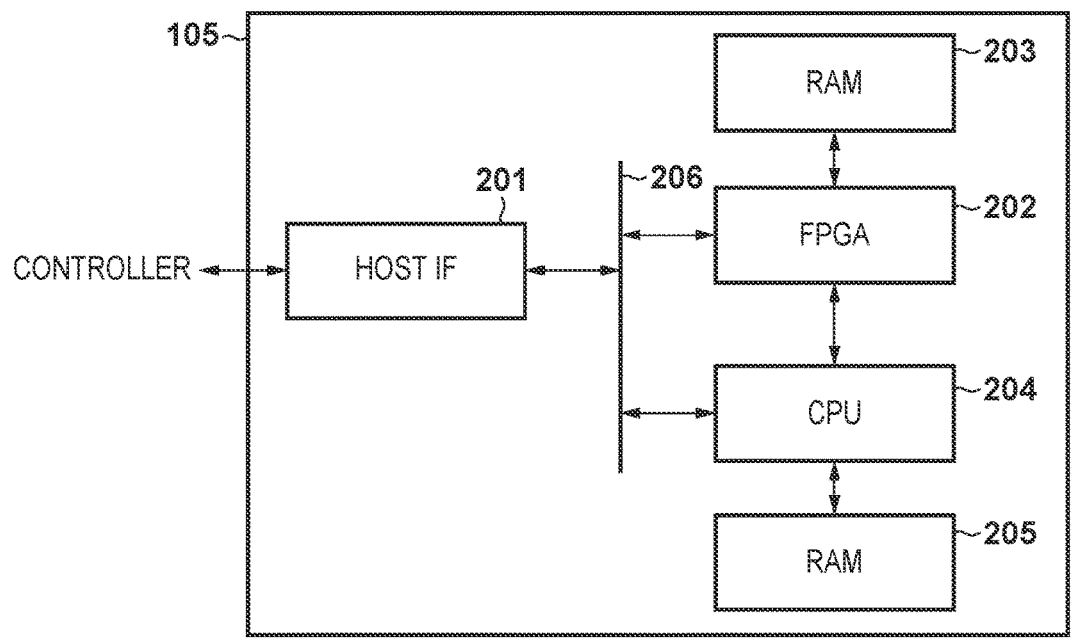
FIG. 2 is a view for illustrating an example configuration of an extension processing unit in accordance with the first embodiment.

Next, explanation will be given for an example configuration of the extension processing unit 105 using FIG. 2 and FIG. 3. The extension processing unit 105 is configured to include a host IF 201, an FPGA 202, a RAM 203, a CPU 204, a RAM 205, and a system bus 206.

The FPGA 202 is an integrated circuit (programmable circuit unit) that is reconfigurable and whose logic circuit can be changed (reconfigured) in accordance with circuit configuration information, and explanation is given with an FPGA as an example in the present embodiment. Circuit configuration information is described later. The FPGA 202 comprises a host IF 304 for connecting with the host IF 201 internally, a memory controller 305 that connects with the RAM 203, an external IF 306 for connecting with the CPU 204, and a functional unit 302 which is a logic circuit region that can be reconfigured. Also, upon power source activation, the FPGA 202 reads setting information of fixed circuit units which are the IFs of the FPGA 202 (the host IF 304, the memory controller 305, the external IF 306) from the ROM (not shown). The FPGA 202 enters a state in which it is able to communicate with each IF by the settings of each IF's fixed circuit unit being performed based on setting information that is read.

The RAM 203 is a main memory used when the FPGA 202 operates, and the RAM 203 is used to temporarily hold intermediate processing data such as image data. The CPU 204 is connected with the host IF 201, the FPGA 202, and the RAM 205, and performs image processing by control of the FPGA 202 and by software. The RAM 205 is memory that can be read or written as necessary and that provides a work area as a main storage unit of the CPU 204, and the RAM 205 is used as an image memory for temporarily storing image data that is internally processed. The system bus 206 is a bus for connecting the host IF 201, the FPGA 202, and the CPU 204.

By connecting the extension processing unit 105 to the main controller 101, the image forming apparatus 100 can execute an image processing function, using the FPGA 202 and the CPU 204, as extension processing. Explanation is given later for control of extension processing using the extension processing unit 105.

Figure 3:
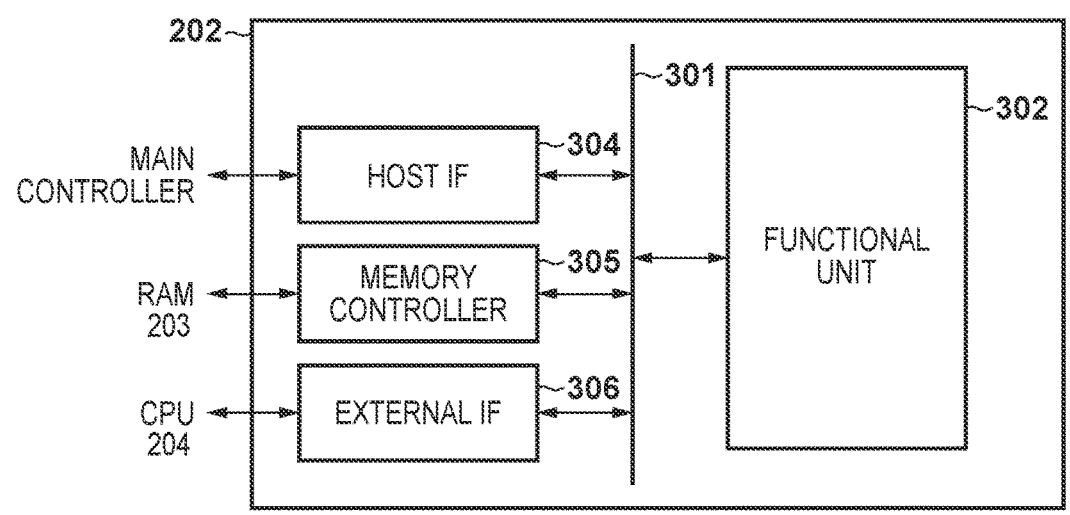
FIG. 3 is a view for illustrating an example configuration of an FPGA in accordance with the first embodiment.

Using FIG. 3, explanation is given of a logic function for configuring the FPGA 202 based on circuit configuration information. The functional unit 302 is a processing unit for which an image processing circuit is comprised based on circuit configuration information. The host IF 304 is connected to the extension IF 129 of the main controller 101 via the host IF 201. For example, the host IF 304 is an interface comprised by PCI Express, and intermediates communication between the CPU 106 and the FPGA 202. The memory controller 305 is an interface for connecting with the RAM 203, and performs a memory control based on data write requests and data read requests received via the functional unit 302, the host IF 304, or the like. The external IF 306 is an interface for connecting with the CPU 204, and performs transmission/reception of data with the CPU 204.

In the present embodiment, the host IF 304, the memory controller 305, and the external IF 306 are fixed circuits configured by a hard macro. The functional unit 302, the host IF 304, the memory controller 305, and the external IF 306 are connected via a system bus 301.

Figures 4, 5:
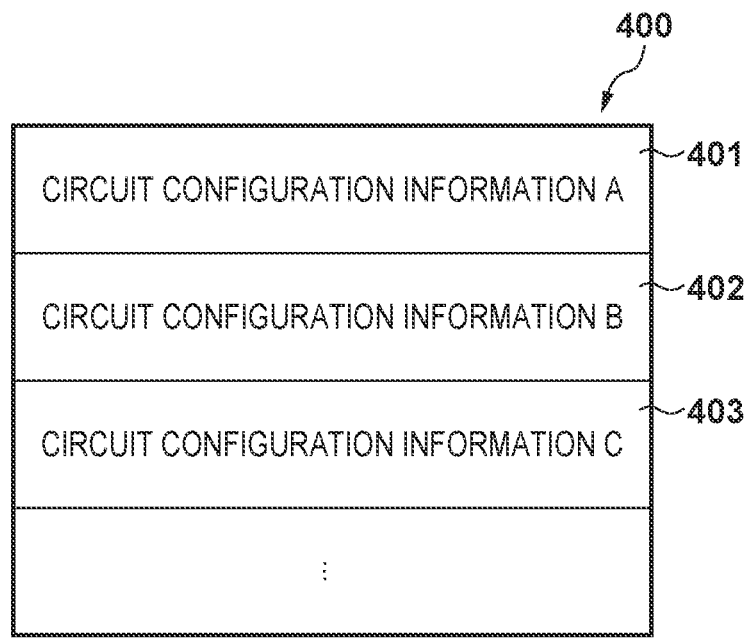
FIG. 4 is a view for illustrating an example of circuit configuration information in accordance with the first embodiment.
FIG. 5 is a view for illustrating an extension process queue in accordance with the first embodiment.

Next, using FIG. 4, explanation will be given of details of circuit configuration information. For the circuit configuration information, a plurality of circuit configuration information items corresponding to each function are held in a storage region 400 for circuit configuration information of the HDD 121. This circuit configuration information is read from the HDD 121 by the CPU 106, transferred to the FPGA 202 via the extension IF 129, and thereby a reconfiguration of the FPGA 202 is performed.

The circuit configuration information is circuit information of the system bus 301 and the functional unit 302, and the FPGA 202 is reconfigured based on the circuit information. Multiple circuit configuration information items are prepared in accordance with a type of a function of the circuit comprised by the functional unit 302. In the present embodiment, circuit configuration information A401, circuit configuration information B402, and circuit configuration information C403 are prepared and included, and these are information of circuits that can execute different image processing respectively. For example, image processing that becomes executable by the FPGA 202 being reconfigured using the circuit configuration information is given as resolution conversion processing, color space processing, image processing, or the like. In the present embodiment, circuit configuration information A is circuit configuration information corresponding to a process A. Similarly, circuit configuration information B corresponds to a process B, and circuit configuration information C corresponds to a process C.

Next, explanation will be given for a copy job for performing a typical operation using the extension processing unit 105 in the image forming apparatus 100 according to the present embodiment. The CPU 106 detects an instruction for executing a copy job by a user via the operation unit 102. A copy job is something for which setting using extension processing (typically image processing) provided by the extension processing unit 105 is performed. If the execution of a copy job is instructed, the CPU 106 instructs that the scanner 103 read an original via the device IF 116. The scanner 103 transmits the read image data to the scanner image processing unit 117 via the device IF 116. The scanner image processing unit 117 performs various image processing for scanning on the received image data, and transmits the image data after image processing to the RAM 107. Next, the CPU 106 transmits image data stored in the RAM 107 to a processing unit in accordance with the processing configuration decided based on a processing flow described later. The processing unit, having received the image data, performs extension processing, and transmits a result of processing to the RAM 107. In the present embodiment, a processing unit for performing processing in accordance with a processing configuration is either the extension processing unit 105 (the FPGA 202, the CPU 204) or the CPU 106. Next, the CPU 106 transmits image data after the extension image processing to the printer image processing unit 118 from the RAM 107. The printer image processing unit 118 performs image processing related to various printing on the received image data, and transmits the result to the printer 104. The printer 104 prints the received image data on a storage medium such as a sheet or the like.

Next, with an example of a job such as for copying as described above, explanation will be given for an extension processing control flow for when performing image processing using the extension processing unit 105 which is a feature of the present invention. The extension processing control flow is explained based on the flowchart of FIG. 9. This processing is entirely executed by the CPU 106, and is implemented by various software modules illustrated in FIG. 17. This corresponds to 3 pieces of software of reference numerals 1701 through to 1703, and these pieces of software can operate concurrently. A software 1701 functions as an extension processing request reception processing unit, and performs processing of step S900 illustrated in FIG. 9. A software 1702 functions as an extension processing main control unit, and performs processing of step S901 to step S906 illustrated in FIG. 9. A software 1703 functions as an extension processing termination processing unit, and performs processing of step S907 illustrated in FIG. 9. This software starts operation upon a power source activation of the image forming apparatus 100. Note that the above described configuration is an example in the present embodiment, and limitation is not made to this. For example, each processing unit may be implemented by 1 piece of software.

Also, in the present embodiment, in processing such as that for a copy, or the like, that is designated by a user, it is determined whether or not processing by the extension processing unit 105 is necessary by processing (not shown) performed by the CPU 106. If it is determined that processing by the extension processing unit 105 is necessary, an extension processing request to the extension processing unit 105 is issued by an HTTP (Hyper Text Transfer Protocol) communication to other software (not shown) operating on the CPU 106.

Figure 10:
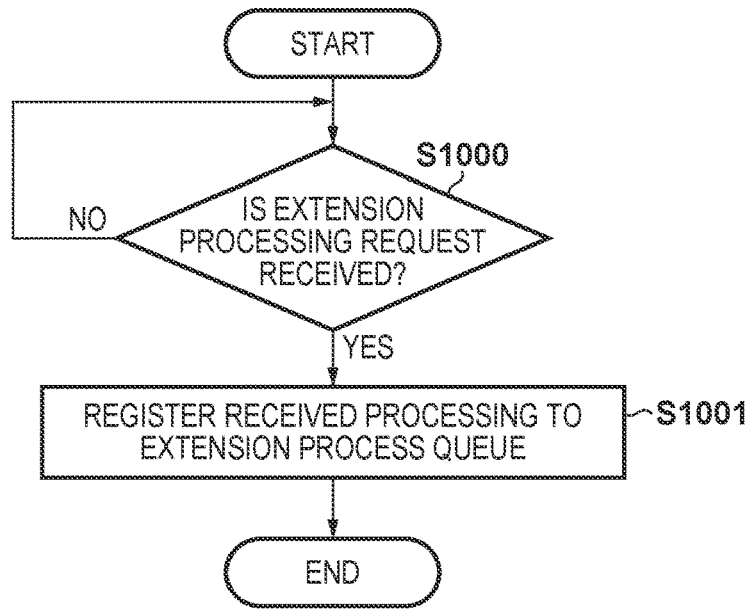
FIG. 10 is a flowchart for extension processing request reception processing in accordance with the first embodiment.

In step S900, the CPU 106 performs extension processing request reception processing. Explanation is given for the extension processing request reception processing using FIG. 10.

In step S1000, the CPU 106 determines whether or not the above described extension processing request is received. As described above, in the present embodiment, the extension processing request is issued by an HTTP communication. Accordingly, it is possible to realize detection of whether or not the extension processing request is received by monitoring a predetermined port. However, this extension processing request communication scheme is only an example, and limitation is not made to this. Also, the method of detecting whether or not the extension processing request is received is not something that is limited to the foregoing. If it is determined that the extension processing request is received (YES in step S1000), the processing proceeds to the processing of step S1001, and if it is determined that the extension processing request is not received (NO in step S1000), the extension processing request being received is awaited.

In step S1001, the CPU 106 registers information of the processing requested by the received extension processing request to an extension process queue 500. The extension process queue 500 is a queue for managing requested processing as is illustrated in FIG. 5. The requested processing is registered in chronological order of reception of the extension processing request. For example, in FIG. 5, as a result of receiving requests in the order of the process A, the process B, and the process C, these are registered along with entry numbers in the extension process queue 500 in that order. Note that the extension process queue 500 is something that is formed in the RAM 107 by the CPU 106.

As described above, the extension processing request reception processing (step S900) is implemented as the software 1701, which is of a configuration such that it can operate concurrently to other software processing by the CPU 106, and is something for which operation starts upon a power source activation of the image forming apparatus 100. However, this configuration is an example in the present embodiment, and limitation is not made to this.

Figure 11:
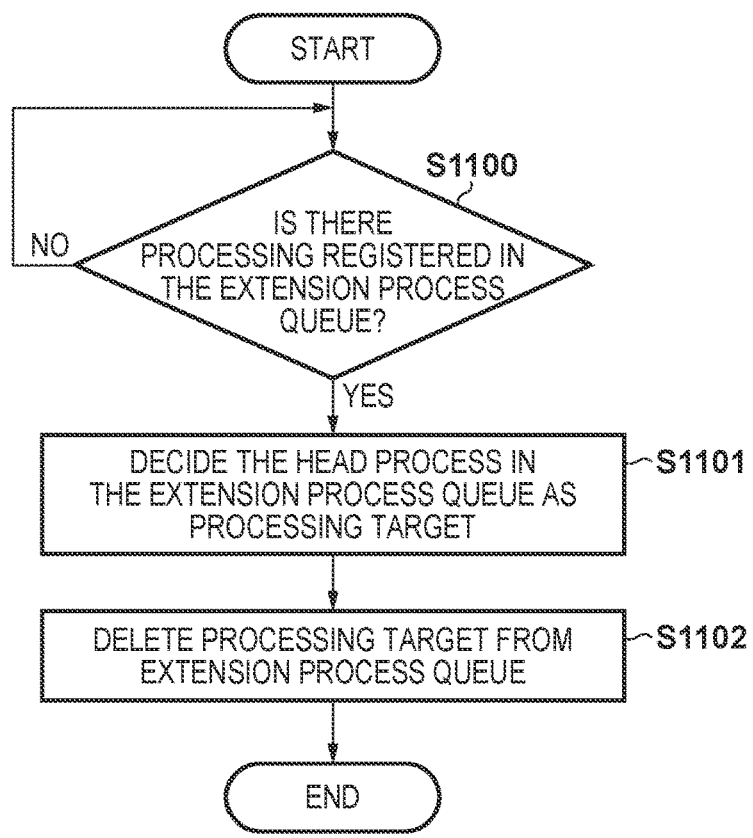
FIG. 11 is a flowchart for extension processing request selection processing in accordance with the first embodiment.

Next, in step S901, the CPU 106 performs extension processing request selection processing. Explanation is given for the extension processing request selection processing using FIG. 11.

In step S1100, the CPU 106 references the extension process queue 500, and determines whether or not there is processing registered in the extension process queue 500. If it is determined that there is processing registered (YES in step S1100), the processing proceeds to step S1101, and if it is determined that there is no registered processing (NO in step S1100), it is waited until processing is registered. For example, if the extension process queue 500 is in the state illustrated in FIG. 5, 1 or more processes are registered, and therefore the CPU 106 determines that there is processing that is registered.

In step S1101, the CPU 106 decides the head process (the process of entry number "1") among the processes registered in the extension process queue 500 as a processing target. Processing that is decided to be the processing target is executed as processing that uses the extension processing unit 105. For example, if the extension process queue 500 is in a state illustrated in FIG. 5, the process A is decided as the processing target. Thereafter, information of the processing target decided by this processing is managed by software (specifically, the software 1702 that functions as the extension processing main control unit).

In step S1102, the CPU 106 deletes the processing target decided in step S1101 from the extension process queue 500. In this deletion, the head process (the process whose entry number is "1") among the processes registered in the extension process queue 500 is deleted, and in accompaniment of the deletion of the head process, the processes from entry number "2" are shifted up. For example, if the extension process queue 500 is in the state illustrated in FIG. 5, the process A whose entry number is "1" is deleted, the entry number of process B becomes "1", and the entry number of process C is shifted up to "2".

Next, in step S902, the CPU 106 performs processing configuration selection processing. Explanation is given for the processing configuration selection processing using FIG. 12.

In step S1200, the CPU 106 obtains processing content of the extension processing that is the processing target. The processing content decided as the processing target is managed by software as explained above. Accordingly, the CPU 106 obtains information of the processing target managed by the software. For example, based on the explanation of the foregoing step S1101, the process A is decided as the processing target, and the process A is obtained as the processing content.

In step S1201, the CPU 106 decides a processing configuration management table corresponding to the processing content. The processing configuration management table is a table defined for each processing content item illustrated in FIG. 8A to FIG. 8C, and is configured by including a processing configuration for executing processing, or an element such as a priority of each processing configuration. Here, the processing configuration is a configuration (a combination) of processing units necessary for performing processing, and in the present embodiment, as illustrated by a processing configuration table 700 of FIG. 7, there is present a maximum of four processing configurations in accordance with processing content. The processing configuration table 700 is stored in advance in the HDD 121. In the case of the example illustrated in FIG. 7, the processing configuration A is a processing configuration in which two processing units, the FPGA 202 and the CPU 106, are used. The processing configuration B is a processing configuration that uses two processing units: the FPGA 202 and the CPU 204. The processing configuration C is a processing configuration that uses the CPU 106 as the processing unit. The processing configuration D is a processing configuration that uses the CPU 204 as the processing unit. However, by which processing configuration processing is possible differs in accordance with the processing content. In addition, the priority is for when the processing configuration is selected, and is designated from 1 to 4 in a descending order. The processing configuration and the priority are referred to in a later-described flow. In addition, assume that at least one processing configuration is present in accordance with processing content of the extension processing. Note that although explanation was given of four processing configurations as an example, more processing configurations may be further realized in accordance with a configuration of the extension processing unit 105. In such a case, it is possible to associate processing content in accordance with a combination of configurations in the extension processing unit 105.

FIG. 8A is a processing configuration management table 800 corresponding to the process A. The processing configuration management table 800 is stored in advance in the HDD 121. Four processing configurations are present as processing configurations that can execute the process A. In the processing configuration management table 800, the processing configuration A is defined as the processing configuration of the priority 1, the processing configuration B as the processing configuration of the priority 2, the processing configuration C as the processing configuration A of the priority 3, and the processing configuration D of the processing configuration of the priority 4. FIG. 8B is a processing configuration management table 801 corresponding to the process B. Two processing configurations are present as processing configurations that can execute the process B. In the processing configuration management table 801, the processing configuration B is defined as the processing configuration of the priority 1, and the processing configuration D as the processing configuration of the priority 2. FIG. 8C is a processing configuration management table 802 corresponding to the process C. Two processing configurations are present as processing configurations that can execute the process C. In the processing configuration management table 802, the processing configuration A is defined as the processing configuration of the priority 1, and the processing configuration B as the processing configuration of the priority 2. In accordance with the processing configuration table illustrated in FIG. 7 and the processing configuration tables illustrated in FIG. 8A to FIG. 8C, definition information of a processing configuration that can be used depending on processing and a state of the image forming apparatus is configured.

For example, if in step S1201 the processing content that is obtained is the process A, the processing configuration management table 800 of FIG. 8A is decided as the processing configuration management table, and referred to in subsequent processing.

In step S1202, the CPU 106 initializes a parameter N, which is a variable, to "0". The parameter N represents a priority used in a series of processes for determining a usable processing configuration.

In step S1203, the CPU 106 obtains information of an availability status (usage condition) of a processing unit usable in extension processing. Explanation is given of this processing in detail. At a time of power source activation, the CPU 106 creates, in the RAM 107, a processing unit availability status management table 600 illustrated in FIG. 6. The processing unit availability status management table 600 is comprised by processing units that are usable as processing units for extension processing, and elements such as an availability status of each processing unit. Upon the availability status of each processing unit resource changing, the processing unit availability status management table 600 is successively updated by the CPU 106. By referring to the processing unit availability status management table 600, the CPU 106 can obtain the availability status of each processing unit. In addition, in accordance with later-described processing, by monitoring the availability status of each processing unit and updating the processing unit availability status management table 600, the CPU 106 manages the statuses. In the present embodiment, processing units usable as a processing unit of extension processing, are the FPGA 202, the CPU 106, and the CPU 204. For example, in the processing unit availability status management table 600 illustrated in FIG. 6, the FPGA 202, the CPU 106, and the CPU 204 are unused, and accordingly all processing units are in an open state, which is a usable state. Namely, each processing unit has a room for processing a currently accepted job and is available for use. If a processing unit is in use for processing another job, the processing unit does not have the room for processing the currently accepted job and is not available for use. In contrast, if the processing unit is not in use for processing another job, the processing unit does have the room for processing the currently accepted job and is available for use. Note that in accordance with a processing unit that configures the extension processing unit 105, the processing units managed by the processing unit availability status management table 600 increase or decrease.

In step S1204, the CPU 106 increments the parameter N. If the value of the parameter N is "0", incrementation—in other words the computation of "+1" is performed—and the value of the parameter N becomes "1".

In step S1205, the CPU 106 determines whether a processing configuration in which the value of the priority is the same as the value of the parameter N is present in processing configurations included in the processing configuration management table decided in step S1201. For example, if the processing configuration management table 800 (FIG. 8A) of the process A is decided as the processing configuration management table, processing configurations of priorities 1 to 4 are present. Thus, if the value of the parameter N is within the range of 1 to 4, it is determined that the processing configuration is present. Similarly, in the case of the process B processing configurations of the priorities 1 to 2 are present in the processing configuration management table 801 (FIG. 8B). Thus, if the value of the parameter N is within the range of 1 to 2, it is determined that the processing configuration is present. Similarly, in the case of the process C processing configurations of the priorities 1 to 2 are present in the processing configuration management table 802 (FIG. 8C). Thus, if the value of the parameter N is within the range of 1 to 2, it is determined that the processing configuration is present. Note that whatever the processing content, because there is always one or more processing configurations present, if the value of the parameter N is "1", it is determined that a processing configuration is necessarily present. If it is determined that a processing configuration is present (YES in step S1205), the processing proceeds to step S1206, and if a processing configuration is determined to not be present (NO in step S1205), the processing returns to step S1202.

In step S1206, the CPU 106 determines whether a processing unit necessary for a processing configuration having a priority that matches the value of the parameter N is usable. This processing is performed by referring to the processing configuration management table and the processing unit availability status management table 600. For example, in a case of the processing configuration of the priority 1 of the process A, the processing configuration becomes the processing configuration A, and necessary processing units are the FPGA 202 and the CPU 106. The CPU 106 performs a determination by considering whether these two processing units (the FPGA 202 and the CPU 106) are in an open state in light of the availability status obtained from the processing unit availability status management table 600 in step S1203. In this way the CPU 106 determines whether processing units necessary for processing can be used. If it is determined that the processing units necessary for the processing configuration having the priority that matches the value of the parameter N are usable (YES in step S1206), the processing proceeds to step S1207, and if not usable is determined (NO in step S1206), the processing returns to step S1204.

In step S1207, the CPU 106 decides the processing configuration of the priority that matches the value of the parameter N as the processing configuration for performing the extension processing. In addition to information of the processing target generated by step S1101, information regarding the decided processing configuration is further managed in combination with the processing configuration. For example, if the processing content is "process A" and the parameter N is "1", "processing configuration A" is decided as the processing configuration. If necessary processing units are usable, "process A" is added as information of the processing target, and information such as "processing configuration A" is managed. In further processing, the information of the generated processing target is referred to.

In step S1208, with respect to the processing unit availability status management table 600, the CPU 106 updates a parameter of processing units necessary for the decided processing configuration to "in use". For example, if the processing configuration is decided to be "processing configuration A", because the FPGA 202 and the CPU 106 are used, with respect to the processing unit availability status management table 600 parameters for these two processing units are changed from a "unused" state to an "in use" state. Due to this processing, it is possible to avoid contention between a processing unit and an extension processing request received subsequently.

Next, in step S903, the CPU 106 refers to the information of the managed processing configuration as the information of the target process, and determines whether the selected processing configuration is a processing configuration that uses the FPGA 202. For example, if the selected the processing configuration is "processing configuration A", because the processing units of the FPGA 202 and the CPU 106 are used, it is determined to be a processing configuration that uses the FPGA 202. On the other hand, if the selected the processing configuration is "processing configuration D", because only the processing unit of the CPU 204 is used, the FPGA 202 is not used, and it is determined to not be a processing configuration that uses the FPGA 202. If determined to be a processing configuration that uses the FPGA 202 (YES in step S903), the processing proceeds to step S904, and if it is determined not to be a processing configuration that uses the FPGA 202 (NO in step S903), the processing proceeds to step S906.

In step S904, the CPU 106 issues a reconfiguration request for the FPGA 202. In the issuing of the reconfiguration request, with respect to the software 1704 operated by the CPU 106 that performs the reconfiguration processing of the FPGA 202, by an HTTP communication, information of processing content comprising the processing target and a message representing the reconfiguration request are transmitted. The information of processing content is used in deciding, with respect to the FPGA 202, circuit configuration information that should be reconfigured.

Here, FIG. 13 is used to explain the reconfiguration processing of the FPGA 202. Note that the processing subject of the reconfiguration processing of the FPGA 202 illustrated in FIG. 13 is the software 1704, which is operated by the CPU 106 and receives a request for reconfiguration via an HTTP communication. The software 1704 is independent from the main control flow (FIG. 9), and is implemented in a configuration that can operate in parallel. In addition, operation of the processing flow of FIG. 13 is started at a time of power source activation of the image forming apparatus 100.

In step S1300, the CPU 106 determines whether a request for a reconfiguration of the FPGA 202 is received in accordance with an HTTP communication. At the time of receiving the request for reconfiguration, a message representing the reconfiguration request and information of processing content of the target process are received. The received processing content information is referred to in step S1301. If it is determined that a reconfiguration request is received (YES in step S1300), transition is made to the processing of step S1301, and if it is determined that the reconfiguration request is not received (NO in step S1300), the reconfiguration request being received is awaited.

In step S1301, the CPU 106 decides the circuit configuration information to be reconfigured in the FPGA 202. This processing is processing that decides corresponding circuit configuration information, based on information of the received processing content. In the present embodiment, as explained above, the circuit configuration information A corresponds to the process A, the circuit configuration information B to the process B, and the circuit configuration information C to the process C. Accordingly, if the received information of the processing content is of the process A, the circuit configuration information A is decided as the circuit configuration information to be reconfigured in the FPGA 202.

In step S1302, the CPU 106 uses the circuit configuration information decided in step S1301, and executes the reconfiguration of the FPGA 202. This processing is performed by the CPU 106 loading the circuit configuration information stored in the HDD 121 into a predetermined storage region (not shown) in the FPGA 202 via the extension IF 129. In accordance with this processing, the FPGA 202 is reconfigured to a desired circuit configuration that corresponds to the processing content.

In step S1303, the CPU 106 notifies the completion of the reconfiguration of the FPGA 202 to the source of the request for the reconfiguration of the FPGA 202. The notification of completion is performed by an HTTP communication. In this notification, a message representing completion is transmitted.

Next, in step S905, the CPU 106 determines whether the reconfiguration of the FPGA 202 has completed. As explained using FIG. 13, in the reconfiguration processing of the FPGA 202, the request of reconfiguration and the notification of completion are performed by HTTP communications. Accordingly, whether completion is notified can be determined in accordance with whether a message representing the notification of the completion corresponding to the request for reconfiguration has been received. If it is determined that the reconfiguration has completed (YES in step S905), the processing proceeds to step S906, and if is determined that the reconfiguration has not completed (NO in step S905), a notification of completion is received is awaited.

In step S906, the CPU 106 issues, by an HTTP communication, an image processing request to a CPU to became a processing unit of the processing configuration selected by step S902 (the CPU 106 or the CPU 204). In the issuing of the image processing request, a message representing the image processing request, information of the processing configuration and the processing content of the processing target, and image data are transmitted to the software 1705, operated by the CPU 106 or the CPU 204, that performs image processing control. The issuance destination of the image processing request changes based on the selected processing configuration; changing of the issuance destination is, for example, realized by changing an IP address or port number that is accessed.

Figure 16:
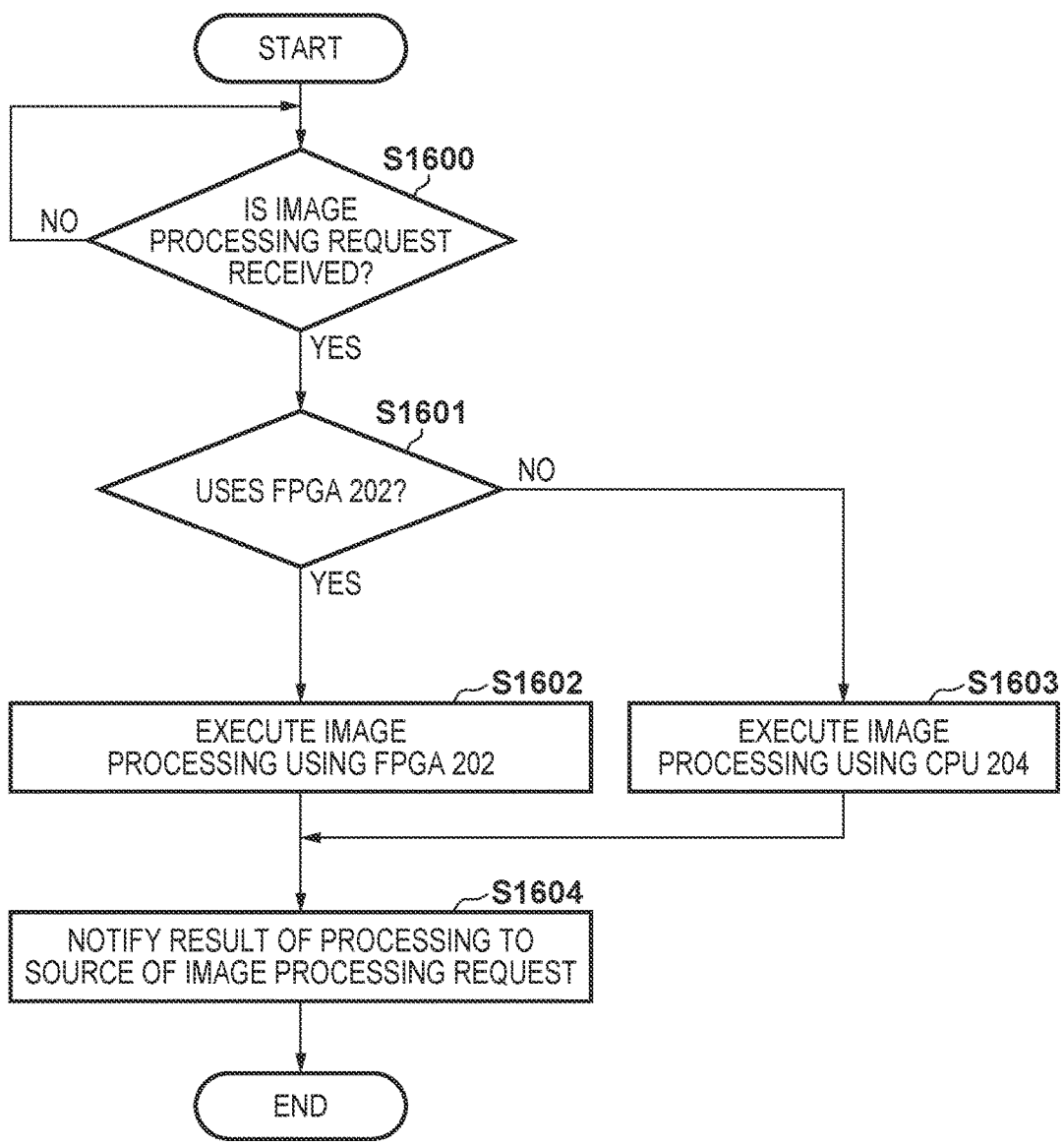
FIG. 16 is a flowchart for image processing control processing in accordance with the first embodiment.

Based on the flowcharts of FIG. 15 and FIG. 16, explanation is given of image processing control performed by each the CPU. Note that the processing subject of the image processing control illustrated in FIG. 15 is the software 1705, which is operated by the CPU 106 and receives an image processing request via an HTTP communication. Note that the processing subject of the image processing control illustrated in FIG. 16 is software 1706, which is operated by the CPU 204 and receives an image processing request via an HTTP communication. These softwares are independent from the main control flow (FIG. 9), and are implemented in a configuration that can operate in parallel. In addition, operation of the processing flows of FIG. 15 and FIG. 16 are started at a time of power source activation of the image forming apparatus 100.

Firstly, explanation will be given the flowchart of FIG. 15 in which processing is performed by the CPU 106.

In step S1500, the CPU 106 determines whether or not the image processing request is received. In the present embodiment, whether an image processing request has been received by an HTTP communication is determined. In the image processing request, a message representing the image processing request, information of a processing configuration and processing content of the target process, and image data are simultaneously received. If it is determined that an image processing request is received (YES in step S1500), the processing proceeds to the processing of step S1501, and if it is determined that the image processing request is not received (NO in step S1500), the image processing request being received is awaited.

In step S1501, the CPU 106 determines whether or not processing is performed using the FPGA 202. This processing is performed by referring to information of the processing configuration of the target process included in the image processing request received in step S1500. For example, if information of the processing configuration A is received, it is understood that the FPGA 202 and the CPU 106 are used as processing units, and it is determined that the FPGA 202 is used. If it is determined that the FPGA 202 is used (YES in step S1501), the processing proceeds to step S1502, and if it determined that the FPGA 202 is not used (NO in step S1501), the processing proceeds to step S1503.

In step S1502, the CPU 106 uses the FPGA 202 and executes image processing. Before this processing is performed, in step S1302 the FPGA 202 is reconfigured to a desired circuit configuration in accordance with the processing content. Accordingly, in this processing, firstly the CPU 106 transfers the image data received in step S1500 to the RAM 203 connected to the FPGA 202, via the extension IF 129. Next, the CPU 106 causes image processing to be performed by performing a setting with respect to the circuit configured in the FPGA 202. Finally, the CPU 106 obtains the image data after image processing from the RAM 203. By the foregoing processing, the CPU 106 uses the FPGA 202 and executes image processing. Thereafter the processing proceeds to step S1504.

In step S1503, the CPU 106 executes image processing by itself. This processing is software image processing performed by the CPU 106 on the image data received in step S1500. Thereafter the processing proceeds to step S1504.

In step S1504, the CPU 106 notifies the result of processing, by an HTTP communication, to the source of the image processing request. In the notification of the result of processing, a message representing the result of the image processing request (normal termination, error termination, or the like), and the image data after image processing are transmitted. This processing flow is then terminated.

Next, explanation will be given the flowchart of FIG. 16 in which processing is performed by the CPU 204. Note that the present flowchart is essentially the same processing as the flowchart of FIG. 15. However, the CPU, which is the subject that performs the processing, is changed from the CPU 106 to the CPU 204.

In step S1600, the CPU 204 determines whether or not the image processing request is received. In the present embodiment, whether an image processing request has been received by an HTTP communication is determined. In the image processing request, a message representing the image processing request, information of a processing configuration and processing content of the target process, and image data are simultaneously received. If it is determined that the request for image processing is received (YES in step S1600), the processing proceeds to the processing of step S1601, and if it is determined that the request for image processing request is not received (NO in step S1600), the image processing request being received is awaited. Note that the foregoing message, information of the processing configuration and the processing content of the target process, and the image data may be referred to together as a job. In other words, the CPU 204 determines whether it has received a job, and if it is determined that a job has been received, the processing next proceeds to step S1601; otherwise a job being received is awaited.

In step S1601, the CPU 204 determines whether or not processing is performed using the FPGA 202. This processing is performed by referring to information of the processing configuration of the target process included in the image processing request received in step S1600. For example, if information of the processing configuration B is received, it is understood that the FPGA 202 and the CPU 204 are used as processing units, and it is determined that the FPGA 202 is used. If it is determined that the FPGA 202 is used (YES in step S1601), the processing proceeds to step S1602, and if it determined that the FPGA 202 is not used (NO in step S1601), the processing proceeds to step S1603.

In step S1602, the CPU 204 uses the FPGA 202 and executes image processing. Before this processing is performed, in step S1302 the FPGA 202 is reconfigured to a desired circuit configuration in accordance with the processing content. Accordingly, in this processing, firstly the CPU 204 transfers the image data received in step S1600 to the RAM 203 connected to the FPGA 202, via the external IF 306. Next, the CPU 204 causes image processing to be performed by performing a setting with respect to the circuit configured in the FPGA 202. Finally, the CPU 204 obtains the image data after image processing from the RAM 203. By the foregoing processing, the CPU 204 uses the FPGA 202 to execute the image processing. Thereafter the processing proceeds to step S1604.

In step S1603, the CPU 204 executes image processing by itself. This processing is software image processing performed by the CPU 204 on the image data received in step S1600. Thereafter the processing proceeds to step S1604.

In step S1604, the CPU 204 notifies the result of processing, by an HTTP communication, to the source of the image processing request. In the notification of the result of processing, a message representing the result of the image processing request (normal termination, error termination, or the like), and the image data after image processing are transmitted. This processing flow is then terminated.

Next, in step S907, the CPU 106 performs extension processing termination processing. Explanation is given for the termination processing using FIG. 14.

In step S1400, the CPU 106 determines whether processing in the selected processing configuration has completed. In step S1504 of FIG. 15 or in step S1604 of FIG. 16, the result of processing, which includes a message representing the result of the image processing request and the image data after the image processing, is transmitted by an HTTP communication. In the present step, a determination is performed by whether the result of processing has been received. If it is determined that the result of processing is received (YES in step S1400), the processing proceeds to the processing of step S1401, and if it is determined that the result of processing is not received (NO in step S1400), the result of processing being received is awaited.

In step S1401, with respect to the processing unit availability status management table 600, the CPU 106 changes the status of processing units used in the processing configuration for which the processing completed to be "unused". For example, if the processing performed by the processing configuration A has completed, because it indicates that the FPGA 202 and the CPU 106 were used, the availability status of the CPU 106 and the FPGA 202 of the processing unit availability status management table 600 is changed from in use to "unused". In accordance with this processing, it becomes possible to use these two processing units in other extension processing.

In step S1402, the CPU 106 notifies the result of processing of the completed extension processing to the source of the extension processing request by an HTTP communication. In the notification of the result of processing, a message representing the result of the extension processing (normal termination, error termination, or the like), and the image data after the extension processing are transmitted. With this transmission the requested extension processing completes. This processing flow is then terminated.

Thus, in the present embodiment, to perform the requested extension processing, a processing configuration is decided from a plurality of processing configurations that are present by referring to an availability status of processing units necessary for the processing configuration and the priority thereof. Thereby, it is possible to perform extension processing with an appropriate performance.

<Second Embodiment>

In the first embodiment, if a plurality of processes are received at the same time in the extension process queue 500, processing is performed in accordance with a reception order by the extension processing unit 105. Incidentally, processing performed by the extension processing unit 105 is a part of a plurality of processes performed to realize processing (hereinafter, a "job"), such as printing or scanning which is received by the image forming apparatus 100. For example, in a print job that includes processing performed by the extension processing unit 105, after processing by the extension processing unit 105 is performed, processing by the printer image processing unit 118 is also performed, and thereafter, print output processing is performed by the printer 104. At this point, because there is one sheet output unit (not shown) that the printer 104 is provided with, only one print job can be executed at once as subsequent processing (hereinafter, "subsequent processing") that the printer image processing unit 118 and the printer 104 performs.

In such a case, a plurality of processing requests are received in accordance with each job progress status, and sequentially in the reception order, registration to the extension process queue 500 is performed. If subsequent processing of a plurality of processes is different, there are cases in which, while a job that includes processing to be performed first by the extension processing unit 105 is waiting due to subsequent processing, a job that includes processing to be performed by the extension processing unit 105 later terminates first. In particular, if processes that use only the FPGA 202 in the extension processing unit 105 are in contention with each other, the waiting time until usage of the FPGA 202 by a preceding process terminates is wasteful to a subsequent process.

Accordingly, in the present embodiment, it is determined whether a job that includes processing to be executed by the extension processing unit 105 generates contention waiting with another job due to subsequent processing of the extension processing unit 105, and controls so as to perform the extension processing preferentially for processing that does not generate contention waiting.

FIG. 18 is a view for illustrating an example configuration of a job processing state table for managing a processing state of a job according to the present embodiment. The job processing state table is generated by the CPU 106 for each job, in accordance with a processing setting of a print instruction from a host computer (not shown), or a push scan or copy accepted via the operation unit 102. The job processing state table includes one or more processes that configures a job, processing units that execute the processes, a processing order that indicates an order in which to execute the processes, and a processing state that indicates whether the execution of each processing unit has finished (progress status of the process). After performing pre-processing setting such as a register setting, in an order of the processing having the processing order of "1" based on the generated job processing state table, the CPU 106 instructs processing start. In accordance with this, the CPU 106 updates the state of corresponding processes from "not yet" to "currently being processed". In addition, upon receiving a termination interrupt (not shown) with respect to a process for which execution is started from each processing unit, the CPU 106 updates the state of the corresponding process to "terminated". A unit that becomes a subject that executes a process indicated here is not limited to each CPU or the extension processing unit 105, and for example each unit that configures the image forming apparatus 100, such as the scanner 103 or the printer 104, is included.

In the present embodiment, the image forming apparatus 100 receives each job—"print 1", "print 2", and "push scan 1"—in this order, and the CPU 106 generates respectively corresponding job processing state tables 1800, 1810, and 1820. At this point, the job processing state tables 1800, 1810, and 1820 represent states at a certain time. In other words, at this certain time, the print 1 indicates that print image processing of a processing order 4 is "currently being processed" by the printer image processing unit 118. In addition, at this point, the print 2 has finished up until RIP processing of the processing order 3. In addition, at this point the push scan 1 is finished up until scan image processing of the processing order 2. Because the next process in each job of the print 2 and the push scan 1 is a process that uses the extension processing unit 105, the CPU 106 next inputs these two extension processing requests to the extension process queue 500. Here, assume that the RIP processing included in the job of the print 2 (the process for which the processing order in the print 2 is 3) terminates before scan image processing included in the job of the push scan 1 (the process for which the processing order in the push scan 1 is 2). Accordingly, the CPU 106 issues an extension processing request for extension print processing included in the job of the print 2, and subsequently outputs an extension processing request for extension scan processing included in the job of the push scan 1. As a result, the extension process queue 500 receives the processing requests in order of the extension print processing and the extension scan processing.

An extension processing control flow in the present embodiment is characterized by selecting and executing, based on the job processing state table, a process that does not generate contention in subsequent processing, from a plurality of processes received by the extension process queue 500.

[Process Flow]

Figure 19:
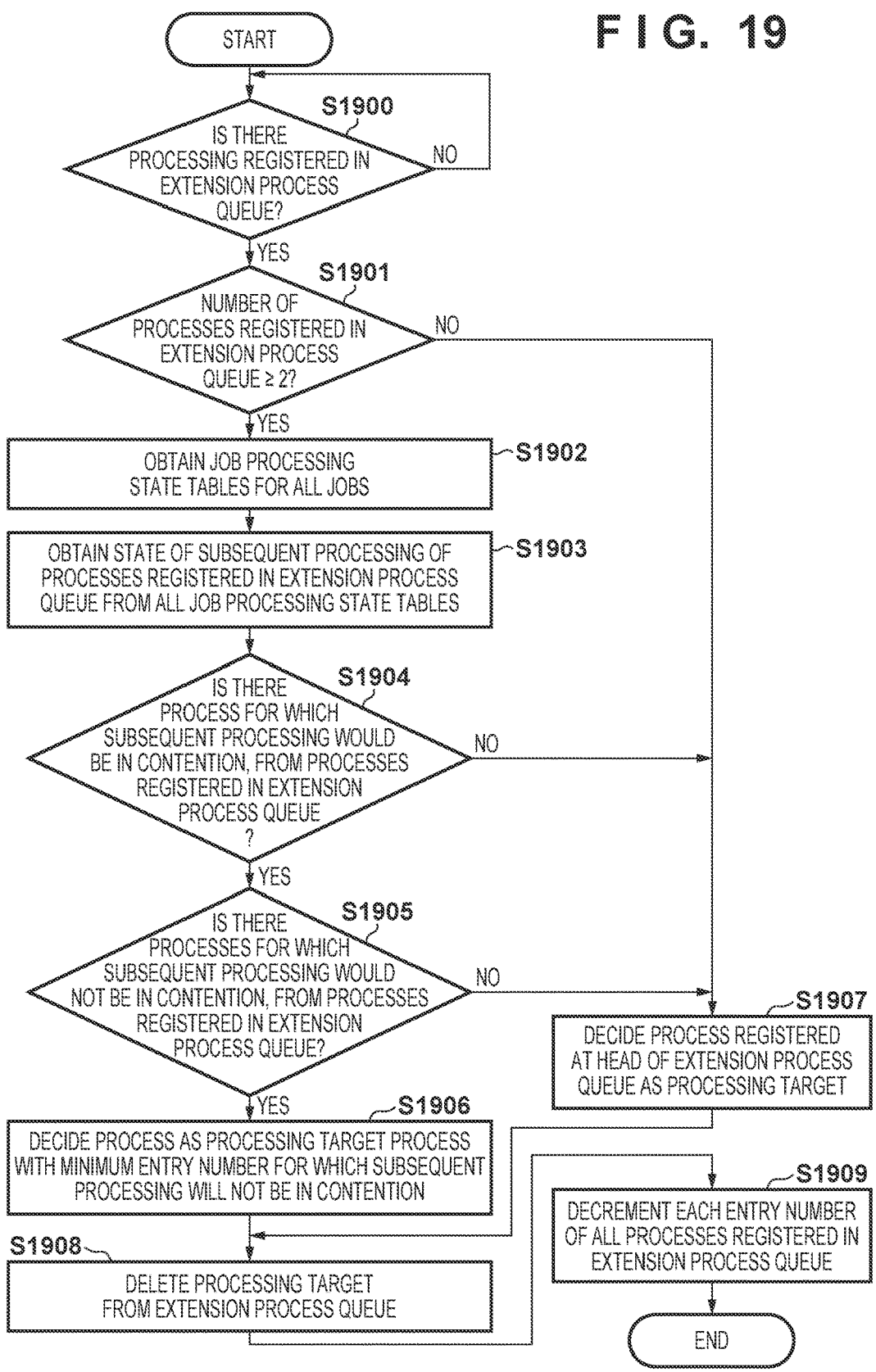
FIG. 19 is a flowchart for extension processing request selection processing in accordance with the second embodiment.

FIG. 19 illustrates control of extension processing request selection processing (step S901 of FIG. 9) of an extension processing control flow according to the present embodiment. Note that, with the extension processing control flow according to the present embodiment, processing other than the extension processing request selection processing (step S901) is the same as the content described in the first embodiment. In addition, after the image forming apparatus 100 is activated the CPU 106 starts all processes of the extension processing control flow.

In step S1900, the CPU 106 references the extension process queue 500, and determines whether or not there is processing registered in the extension process queue 500. If it is determined that there is processing registered (YES in step S1900), the processing proceeds to step S1901, and if it is determined that there is no registered processing (NO in step S1900), it is waited until processing is registered.

In step S1901, the CPU 106 determines whether the number of processes registered in the extension process queue 500 is two or more. In the case of the example of the present embodiment, assume that two extension processing requests—for the extension print processing included in the job of the print 2 and for the extension scan processing included in the job of the push scan 1—are received, and registered in the extension process queue 500. In such a case, the result of the determination of step S1901 is YES. If two or more processes are registered (YES in step S1901), the processing proceeds to step S1902, and if there is one or fewer processes registered (NO in step S1901), the processing proceeds to step S1907.

In step S1902, the CPU 106 obtains job processing state tables for all jobs that the image forming apparatus 100 received. In the case of the example of the present embodiment, the job processing state tables 1800, 1810, and 1820 respectively corresponding to the print 1, the print 2, and the push scan 1 are obtained.

In step S1903, the CPU 106 obtains a state of subsequent processing of the processes registered in the extension process queue 500, from the job processing state tables obtained in step S1902. In the present embodiment, firstly the CPU 106 refers to the job processing state table 1810, which includes extension print processing, and identifies that subsequent processing of the extension print processing is processing that uses the printer image processing unit 118. The CPU 106 then refers to the other job processing state tables 1800 and 1820, and obtains the state of the printer image processing unit 118 (the execution status of processes). Similarly, the CPU 106 refers to the job processing state table 1820, which includes extension scan processing, and identifies that subsequent processing of the extension scan processing is processes that uses the CPU 106. The CPU 106 then refers to the other job processing state tables 1800 and 1810, and obtains the state of the CPU 106 (the processing execution status).

In step S1904, the CPU 106 determines, based on the states obtained in step S1903, whether there is a process for which subsequent processing would be in contention, from processes registered in the extension process queue 500. In the case of the example of the present embodiment, in the job of the print 1, the state of the printer image processing unit 118 which performs subsequent processing of the extension print processing is "in use". Thus it is in contention with subsequent processing of the job 2, and the result of the determination in step S1904 is YES. If subsequent processing is in contention (YES in step S1904) the processing proceeds to step S1905, and if there is no processing in contention (NO in step S1904), the processing proceeds to step S1907.

In step S1905, the CPU 106 determines, based on the states obtained in step S1903, whether there is a process for which subsequent processing would not be in contention, from processes registered in the extension process queue 500. In the case of the example of the present embodiment, because the state of the CPU 106 which performs subsequent processing of the extension scan processing is not "in use", no contention occurs for subsequent processing that uses the CPU 106. Thus, the result of the determination in step S1905 becomes NO. If that is processing is not in contention (YES in step S1905) the processing proceeds to step S1906, and if there is no processing that is not in contention (NO in step S1905), the processing proceeds to step S1907. If the determination of step S1904 and step S1905 are both YES, it indicates that in the extension process queue 500 there exists a process for which subsequent processing will be in contention, and a process for which subsequent processing will not be in contention.

In step S1906, the CPU 106 decides the process whose entry number is the smallest among the processes registered in the extension process queue 500 as a processing target for which subsequent processing is not in contention. In the case of the example of the present embodiment, the extension scan processing included in the job of the push scan 1 is decided as the processing target. Thereafter, the processing proceeds to step S1908.

In step S1907, the CPU 106 decides the process registered at the head of the extension process queue 500 as the processing target to be executed by the extension processing unit 105. Here there are not simultaneously processes registered in the extension process queue 500 for which subsequent processing is in contention and for which subsequent processing is not in contention. Thereafter, the processing proceeds to step S1908.

In step S1908, the CPU 106 deletes the processing target decided in step S1906 or in step S1907 from the extension process queue 500. In the case of the example of the present embodiment, the extension scan processing is deleted from the extension process queue 500.

In step S1909, the CPU 106 performs processing that decrements each entry number of remaining processes registered in the extension process queue 500. This processing flow is then terminated. In the decrement processing, from registered processes, clip processing is also simultaneously performed such that a minimum entry number becomes "1". In the case of the example of the present embodiment, as a result of the processing of the present step, the entry number of the extension print processing included in the job of the print 2 is "1".

Thus, it is determined whether a job that includes processing to be executed by the extension processing unit 105 generates contention waiting with another job in subsequent processing of the extension processing unit 105. Furthermore, from processes registered in the extension process queue 500, a process that does not generate contention waiting is decided. Thereby, in addition to the effect of the first embodiment, it is possible to execute processes efficiently by controlling an order of processes in the extension processing unit 105 such that contention waiting in subsequent stages of the extension processing unit 105 does not occur.

<Third Embodiment>

In the first embodiment, in the processing configuration selection processing flow illustrated in FIG. 12, a processing configuration is decided from an availability status of the CPU 106, the CPU 204, and the FPGA 202. In addition, as explained in the first embodiment, the image forming apparatus 100 has two types of power states: a normal state and a power saving state. In the power saving state, the image forming apparatus 100 controls so that power supply is not performed to the circuit element 140 and the circuit element 142, which includes the extension processing unit 105 comprising the CPU 204 and the FPGA 202. Accordingly, explanation is given, as the third embodiment, of a processing configuration selection method in accordance with such a power state of the image forming apparatus 100. Note that, explanation is omitted of parts that overlap with the first embodiment, and explanation is given of only differences.

FIG. 20 illustrates an example configuration of priority setting information 2000 according to the present embodiment. The priority setting information 2000 is information indicating whether to process with power prioritized or to process with performance prioritized in a case where a processing request is received at a time of the power saving state. Priority information 2001 is a setting value indicating one of "prioritize power" or "prioritize performance" as a priority setting. In other words, if "prioritize power" is set, when the current image forming apparatus 100 is in the power saving power mode, operations in the power mode are prioritized. However, if "prioritize performance" is set, processing performance is prioritized, and based on the selected processing configuration, the power saving power mode is caused to revert to the normal power mode. The priority setting information 2000 is stored in advance in one of the ROM 108, the Flash 109, or the HDD 121. In addition, the priority information 2001 may be configured to be changed by the CPU 106 detecting an instruction to the operation unit 102 by a user.

FIG. 21 illustrates an example configuration of power state information 2100 according to the present embodiment. The power state information 2100 illustrates a power state of the image forming apparatus 100, and is stored in the power source control unit 122. A power state 2101 indicates a power state at the current time of the image forming apparatus 100. When the power source control unit 122 supplies/disconnects a power supply to the circuit element 140 and the circuit element 142 comprising the extension processing unit 105, a value of the power state 2101 is changed by the power source control unit 122 to be a normal power state/a power saving state.

FIG. 22 illustrates a processing configuration table 2200 according to the present embodiment. Similarly to in the first embodiment, there is also present a maximum of four processing configurations in the present embodiment, based on processing content. The processing configuration A is a processing configuration that uses two processing units: the FPGA 202 and the CPU 106. The processing configuration B is a processing configuration that uses two processing units: the FPGA 202 and the CPU 204. The processing configuration C is a processing configuration that uses the CPU 106 as the processing unit. The processing configuration D is a processing configuration that uses the CPU 204 as the processing unit. However, by which processing configuration processing is possible differs in accordance with the processing content. In addition, the priority is for when the processing configuration is selected, and is set from 1 to 4 in a descending order. In addition, at least one processing configuration is present in accordance with the processing content. Also, power-saving-time usage possibility information 2201 is information that indicates whether each processing configuration can be used when the image forming apparatus 100 is in the power saving state. For example, the processing configuration A is a processing configuration that uses the FPGA 202 and the CPU 106 as described above. Because the FPGA 202 is included in the extension processing unit 105, the power source is off at a time of the power saving state. Therefore, the power-saving-time usage possibility information 2201 is "x", which indicates that usage is not possible at a time of power saving. Similarly, the power-saving-time usage possibility information 2201, in accordance with whether the power source at a time of the power saving state for each processing configuration is off, is stored in the ROM 108, the Flash 109, or the HDD 121 as information where "x" indicates that usage is not possible and "○" indicates that usage is possible. In other words, by the processing configuration table 2200 according to the present embodiment, based on the power mode, a processing configuration for which usage is restricted is defined.

[Process Flow]

Figure 23A:
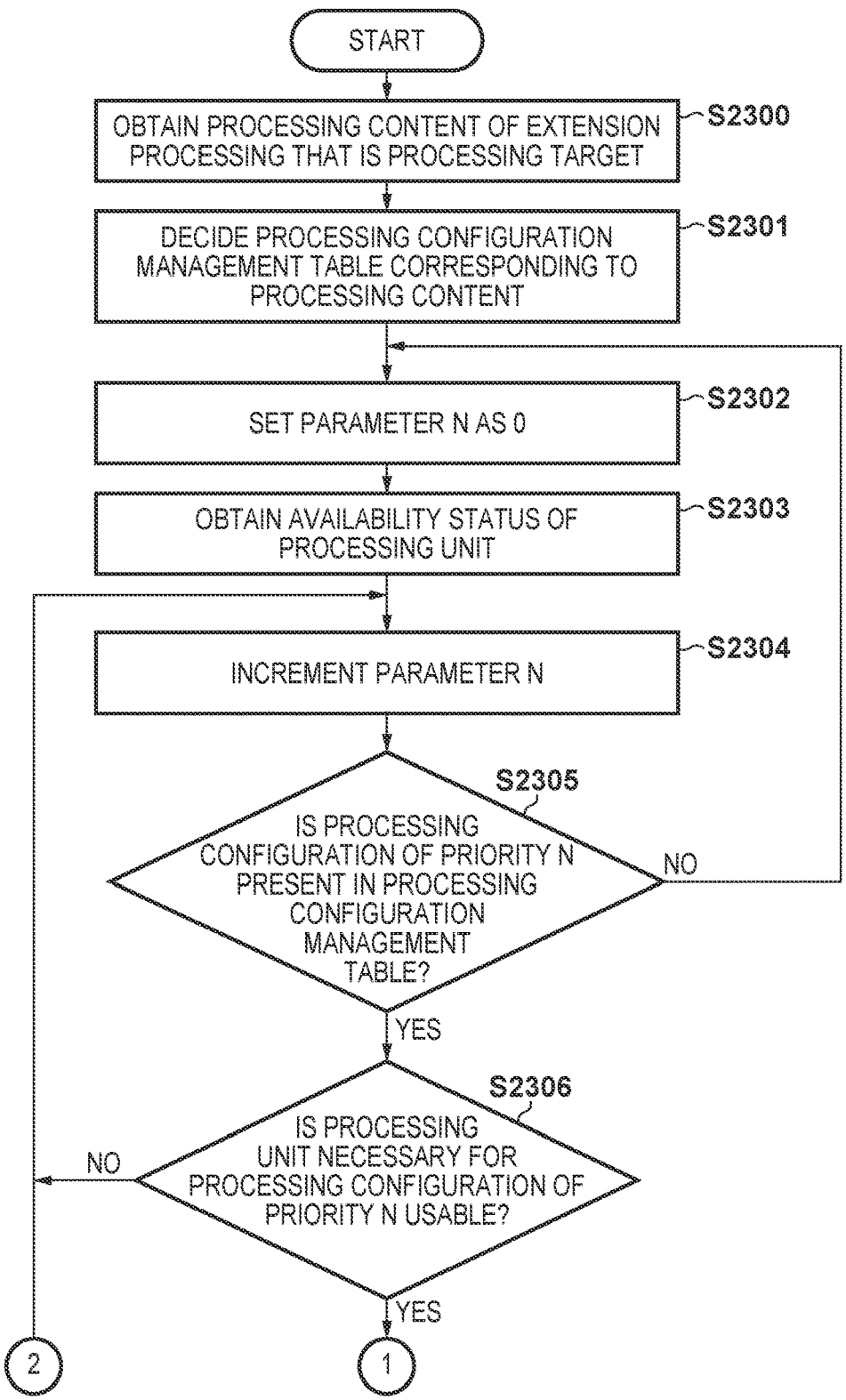
FIGS. 23A and 23B are flowcharts for processing configuration selection processing in accordance with the third embodiment.
Figure 23B:
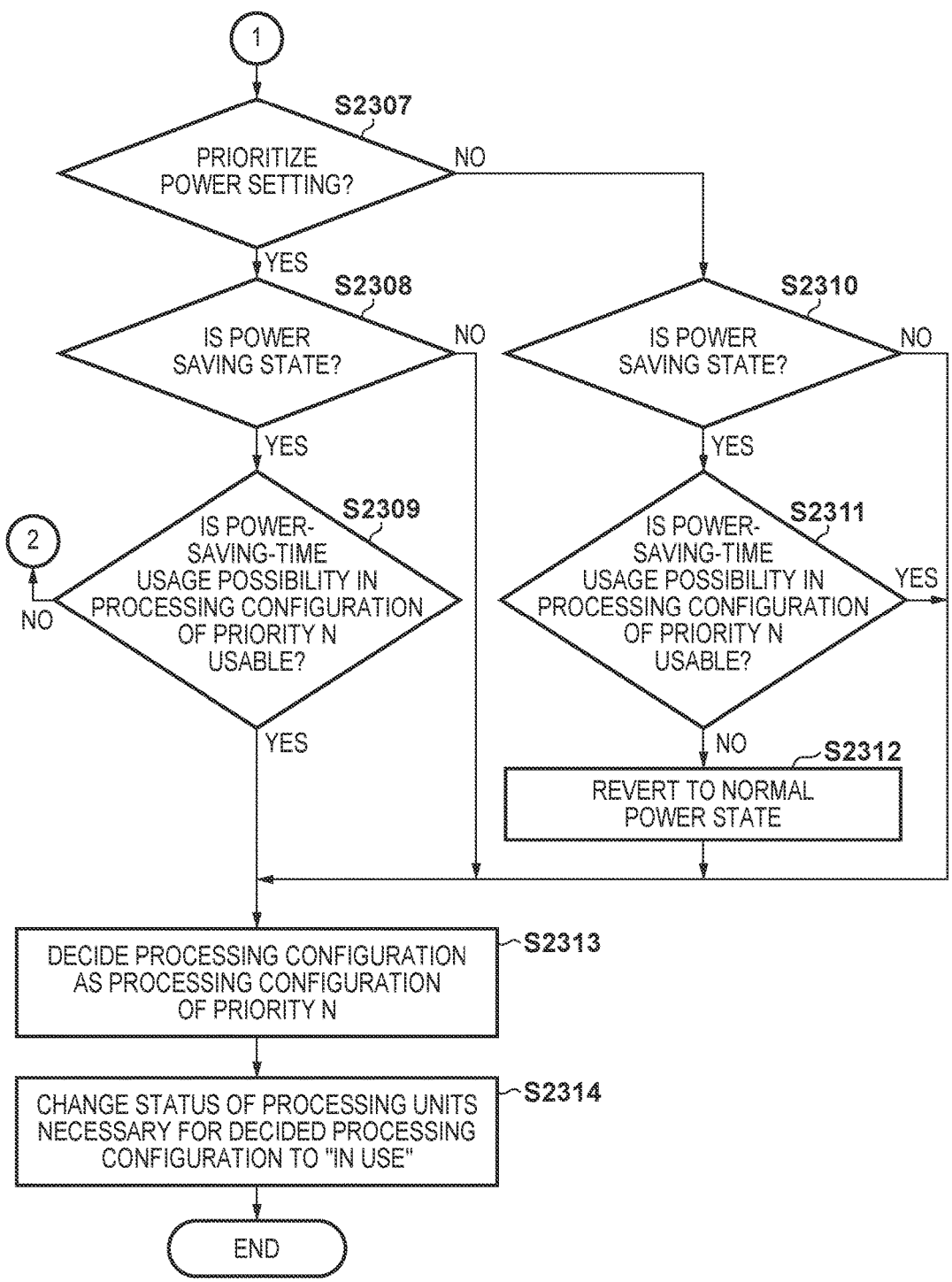

For the extension processing control flow of the image forming apparatus 100 according to the present embodiment, only processing configuration selection processing (step S902) is different from processing illustrated in FIG. 9 and described in the first embodiment. Content of the processing configuration selection processing according to the present embodiment (step S902) will be explained using FIGS. 23A and 23B. To the extent that there is no particular explanation, the present flowchart is realized by the CPU 106 using the RAM 107 to perform the flowchart in accordance with a program stored in the ROM 108, the Flash 109, or the HDD 121 of the image forming apparatus 100.

In step S2300, the CPU 106 obtains processing content of the extension processing that is the processing target. The processing content decided as the processing target is managed by software as explained above. Accordingly, the CPU 106 obtains information of the processing target managed by the software. Here, assume that "process A" is obtained as the processing content.

In step S2301, the CPU 106 decides a processing configuration management table corresponding to the processing content. In the case of the example of the present embodiment, as illustrated in FIG. 8A to FIG. 8C and in accordance with processing content illustrated in FIG. 22, a maximum of four processing configurations are present. For example, if in step S2301 "process A" is obtained as the processing content, the processing configuration management table 800 of FIG. 8A is decided as the processing configuration management table, and referred to in subsequent processing.

In step S2302, the CPU 106 initializes the parameter N, which is a variable representing priority, to "0". In step S2303, the CPU 106 obtains the availability status of a processing unit usable in extension processing. Note that at a time of power source activation, the CPU 106 creates the processing unit availability status management table 600 illustrated in FIG. 6. Because the processing unit availability status management table 600 is the same as that in the first embodiment, explanation thereof is omitted here.

In step S2304, the CPU 106 increments the parameter N which represents priority. If the value of the parameter N is "0", incrementation—in other words the computation of "+1" is performed—and the value of the parameter N becomes "1".

In step S2305, the CPU 106 determines whether a processing configuration in which the value of the priority is the same as the value of the parameter N is present in processing configurations included in the processing configuration management table decided in step S2301. For example, if the processing configuration management table 800 (FIG. 8A) of the process A is decided as the processing configuration management table, processing configurations of priorities 1 to 4 are present. Thus, if the value of the parameter N is within the range of 1 to 4, it is determined that the processing configuration is present. Other processes are similarly determined. If it is determined that a processing configuration is present (YES in step S2305), the processing proceeds to step S2306, and if a processing configuration is determined to not be present (NO in step S2305), the processing returns to step S2302.

In step S2306, the CPU 106 determines whether a processing unit necessary for a processing configuration having a priority that matches the value of the parameter N is usable. This processing is performed by referring to the processing configuration management table and the processing unit availability status management table similarly to in the first embodiment. If it is determined that the processing units necessary for the processing configuration having the priority that matches the value of the parameter N are usable (YES in step S2306), the processing proceeds to step S2307, and if not usable is determined (NO in step S2306), the processing returns to step S2304.

In step S2307, the CPU 106 refers to the priority setting information 2000 illustrated in FIG. 20, and determines whether the priority information 2001 is stored as "prioritize power". If prioritizing power (YES in step S2307), the processing proceeds to step S2308, and if not prioritizing power (NO in step S2307), the processing proceeds to step S2310.

In step S2308, the CPU 106 refers to the power state information 2100 illustrated in FIG. 21, and determines whether the power state 2101 is stored as "power saving". If power saving (YES in step S2308), the processing proceeds to step S2309, and if normal power (NO in step S2308), the processing proceeds to step S2313.

In step S2309, the CPU 106 determines usage possibility when power saving in the processing configuration having the priority that matches the value of the parameter N. This is determined based on whether, in the processing configuration table 2200 illustrated in FIG. 22, the power-saving-time usage possibility information 2201 of the corresponding processing configuration is usable or not usable. If it is determined that usage possibility when power saving for the processing configuration having the priority that matches the value of the parameter N is that it is usable (YES in step S2309), the processing proceeds to step S2313, and if not usable is determined (NO in step S2309), the processing proceeds to step S2304.

In step S2310, the CPU 106 refers to the power state information 2100 illustrated in FIG. 21, and determines whether the power state 2101 is stored as "power saving". If power saving (YES in step S2310), the processing proceeds to step S2311, and if normal power (NO in step S2310), the processing proceeds to step S2313.

In step S2311, the CPU 106 determines the usage possibility when power saving of the processing configuration having the priority that matches the value of the parameter N. This is determined based on whether, in the processing configuration table 2200 illustrated in FIG. 22, the power-saving-time usage possibility information 2201 of the corresponding processing configuration is usable or not usable. If it is determined that usage possibility when power saving for the processing configuration having the priority that matches the value of the parameter N is that it is usable (YES in step S2311), the processing proceeds to step S2312, and if not usable is determined (NO in step S2311), the processing proceeds to step S2313.

In step S2312, the CPU 106 instructs the power source control unit 122 so as to change from the power saving state to the normal state. Because the image forming apparatus 100 enters the normal power state by this processing, power is supplied to the extension processing unit 105, and the FPGA 202 and the CPU 204 in the extension processing unit 105 become usable.

In step S2313, the CPU 106 decides the processing configuration of the priority that matches the value of the parameter N as the processing configuration for performing the extension processing. In addition to information of the processing target generated by step S1101, information regarding the decided processing configuration is further managed in combination with the processing configuration. This processing is similar to step S1207 of FIG. 12 described in the first embodiment.

In step S2314, with respect to the processing unit availability status management table 600, the CPU 106 updates a parameter of processing units necessary for the decided processing configuration to "in use". For example, if the processing configuration is decided to be "processing configuration A", because the FPGA 202 and the CPU 106 are used, with respect to the processing unit availability status management table 600 parameters for these two processing units are changed from a "unused" state to an in use state.

Thus, in the present embodiment, to perform the requested extension processing, a processing configuration is decided from a plurality of processing configurations that are present in accordance with a power state and an availability status of processing units necessary for the processing configuration and the priority thereof. With this, in addition to the effect of the first embodiment, it is possible to perform extension processing with appropriate power and performance. Note that limitation is not made to two types of power modes, and if the image forming apparatus is operable in more power modes, the values of the priority setting information 2000, the power state information 2100, and the power-saving-time usage possibility information 2201 may be defined based on each power mode. In such a case, a power mode to transition to may be decided based on a current power mode or a selected processing configuration.

<Fourth Embodiment>

In the first embodiment, when processing in a selected processing configuration is complete, the CPU 106 or the CPU 204 performs a notification of processing termination, and in the extension processing control flow the termination processing (step S907 of FIG. 9) receives this notification and updates the processing unit availability status management table 600. In other words, in the case of a processing configuration that uses a CPU and an FPGA, in the first embodiment both the CPU and the FPGA become usable when all processing is complete. Thus, until processing of the CPU is complete, reconfiguration of the FPGA could not be performed.

In the fourth embodiment, a unit by which, when the functional unit (processing circuit) 302 configured in the FPGA 202 has output all processing results to the RAM 203, the processing completion by the FPGA circuit is notified to the corresponding CPU (the CPU 106 and the CPU 204) is provided. Similarly to in the first embodiment, when the corresponding CPU (the CPU 106 and the CPU 204) has obtained the processing results stored in the RAM 203, it notifies processing termination.

In the fourth embodiment, the notification of the processing completion by the FPGA circuit is received, and the column of "FPGA" in the processing unit availability status management table 600 is updated to "unused". Thereafter, the notification of processing termination is received, and the column of the corresponding "CPU" in the processing unit availability status management table 600 is updated to "unused". With this, it becomes possible to select a processing configuration that uses the FPGA at a stage of the processing completion notification by the FPGA circuit, which is before the processing termination notification, and the FPGA can be reconfigured at an early stage. As a result, the processing time can be reduced.

In addition, at the stage of the processing completion notification by the FPGA circuit, a processing configuration that uses the FPGA becomes selectable, and if the available space of the RAM 203 permits, it becomes possible to issue a processing request to the corresponding CPU. Below, explanation is omitted for portions that overlap between the present embodiment and the first embodiment, and only differences are explained.

[Example Configuration of FPGA Memory Usage Table]

Figure 24:
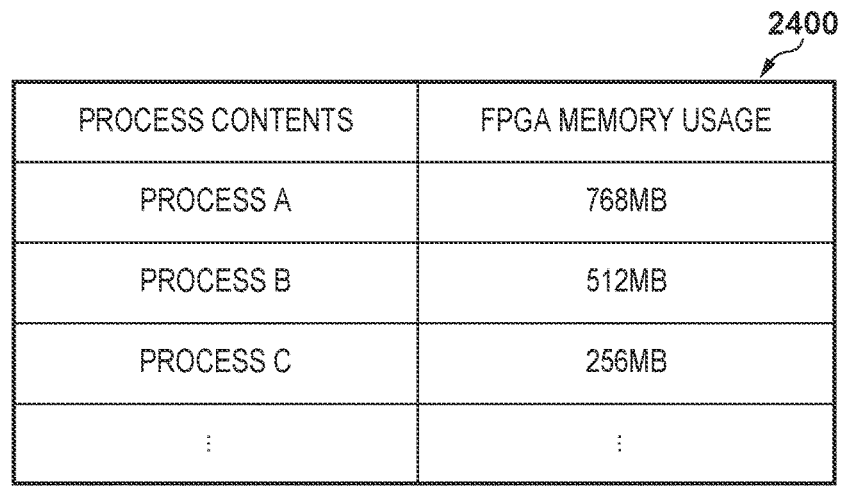
FIG. 24 is a view for illustrating an example configuration of an FPGA memory usage table in accordance with a fourth embodiment.

FIG. 24 is a view for illustrating an example configuration of an FPGA memory usage table 2400 according to the present embodiment. In the case of the example illustrated in FIG. 24, if a processing configuration that uses the FPGA 202 as the process A is selected, the functional unit (processing circuit) 302 configured in the FPGA 202 requires 768 MB as a usage amount of the RAM 203. Similarly, in a case where a processing configuration that uses the FPGA 202 as the process B is selected, the functional unit (processing circuit) 302 configured in the FPGA 202 requires 512 MB as a usage amount of the RAM 203. This applies similarly in regard to the process C.

[Example Configuration of Processing Unit Availability Status Management Table]

Figure 25:
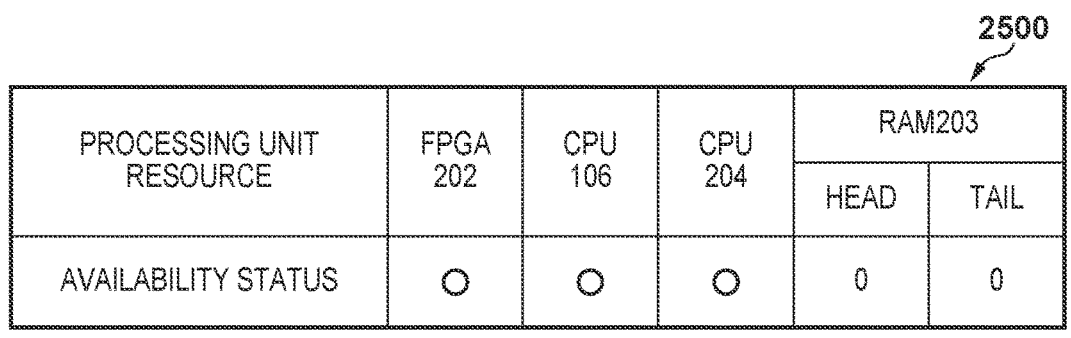
FIG. 25 is a view for illustrating an example configuration a processing unit availability status management table in accordance with the fourth embodiment.

FIG. 25 is a view for illustrating an example configuration of a processing unit availability status management table 2500 according to the present embodiment. A "RAM 203" column is added to the processing unit availability status management table 600 of FIG. 6 described in the first embodiment. In this example, in the column of "RAM 203", the "head" portion illustrates what capacity from the head of the RAM 203 is in use. In the case of the example of FIG. 25, it is indicated that the head portion of the RAM 203 is unused. Also, in the column of "RAM 203", the "tail" portion illustrates what amount from the tail of the RAM 203 is in use. In the case of the example of FIG. 25, it is indicated that the tail portion of the RAM 203 is unused. By subtracting the sum of the value of the head portion and the value of the tail portion indicated in the column of "RAM 203" from the entire storage capacity of the RAM 203, it is possible to obtain the available space of the RAM 203. Note that, in the present embodiment, the value of the column of "FPGA 202" is updated at a timing different to that in the first embodiment. Details are described later.

Note that managing by dividing into the head portion and the tail portion of the RAM 203 is merely an example. Any configuration may be taken such that it is possible to know the free space of the RAM 203.

In the extension processing control flow according to the present embodiment, if a processing configuration that uses the FPGA 202 is selected, after a desired circuit is configured in the FPGA 202, the column of available space of the RAM 203 of the processing unit availability status management table 2500 and the FPGA memory usage table 2400 are referred to. If the usage amount indicated in the FPGA memory usage table 2400 is less than or equal to available space of the RAM 203 of the processing unit availability status management table, a processing request is performed to the corresponding CPU. If it is larger than the available space, it is waited until available space of the RAM 203 exceeds the usage amount indicated by the FPGA memory usage table 2400. When the corresponding CPU has notified FPGA circuit processing completion, because the corresponding CPU obtains the processing result stored in the RAM 203, the column of available space of the RAM 203 of the processing unit availability status management table 2500 is not updated. In the extension processing control flow according to the present embodiment, at the stage in which the notification of processing termination has been received, the column of available space of the RAM 203 of the processing unit availability status management table 2500 is updated.

Note that if the selected processing configuration is a processing configuration that uses the FPGA 202, the functional unit (processing circuit) 302 configured in the FPGA 202 stores the processing result in the RAM 203 connected to the FPGA 202. If the selected processing configuration is for the CPU 106 and the FPGA 202, the CPU 106 obtains the processing result stored in the RAM 203 via the host IF 304 and the memory controller 305. In addition, if the selected processing configuration is for the CPU 204 and the FPGA 202, the CPU 204 obtains the processing result stored in the RAM 203 via the external IF 306 and the memory controller 305 in the FPGA 202. After this obtaining is performed, because the processing result held in the RAM 203 becomes unnecessary, the region in which the processing result is held is released, and can be used as available space.

[Image Processing by CPU 106]

Figure 26:
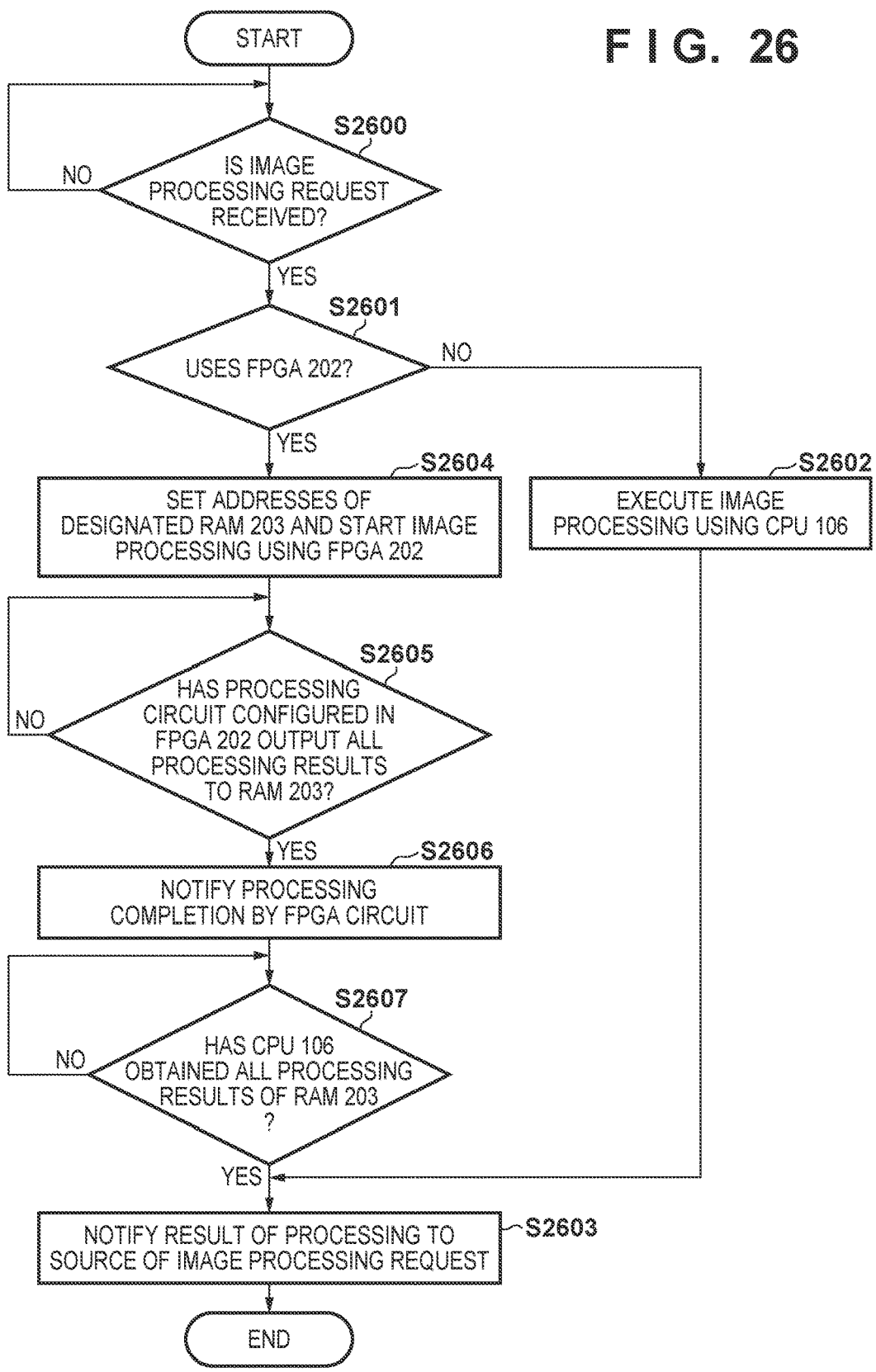
FIG. 26 is a flowchart for image processing in accordance with the fourth embodiment.

FIG. 26 is a flowchart of image processing by the CPU 106 according to the present embodiment. Each procedure of the flowchart of FIG. 26 is executed by the CPU 106 in accordance with software. In the extension processing control flow, this processing flow is started when a processing configuration that uses the CPU 106 is selected and a processing request is performed to the CPU 106. A point that is different to FIG. 15 described in the first embodiment is the point that, if the selected processing configuration uses the FPGA 202, processing completion by the FPGA circuit is notified before the notification of processing termination (step S2604 to step S2607).

In step S2600, the CPU 106 determines whether or not the image processing request is received. If it is determined that an image processing request is received (YES in step S2600), the processing proceeds to the processing of step S2601, and if it is determined that the image processing request is not received (NO in step S2600), the image processing request being received is awaited.

In step S2601, the CPU 106 determines whether the processing configuration of the image processing request is a processing configuration that performs a process that uses the FPGA 202. If it is determined that the processing configuration of the image processing request is a processing configuration that does not use the FPGA 202 (NO in step S2601) the processing proceeds to step S2602, and if it is determined to be a processing configuration that uses the FPGA 202 (YES in step S2601), the processing proceeds to step S2604.

In step S2602, the CPU 106 does not use the FPGA 202 to execute image processing. Thereafter the processing proceeds to step S2603.

In step S2603, the CPU 106 performs a notification of processing termination, and notifies a result of processing to the source of the image processing request. This processing flow is then terminated.

In step S2604, with respect to the processing circuit of the FPGA 202, the CPU 106 starts image processing by initializing an address of the RAM 203 to be used, which is sent along with the image processing request. The initialization here is performed by appropriately setting a register of the processing circuit configured in the FPGA 202. An address of the RAM 203 to be used is decided in accordance with a usage condition of the RAM 203 or an amount of data newly used. Here, the decision of the address is explained in step S2907 or step S2909 of FIG. 29.

In step S2605, the CPU 106 determines whether the processing circuit configured in the FPGA 202 has output all processing results to the RAM 203. The processing circuit configured in the FPGA 202 outputting all processing results to the RAM 203 is notified to the CPU 106 by an interrupt from the processing circuit, and thus can be detected by the CPU 106. Alternatively, the CPU 106 can also detect by polling a register, on the processing circuit, changed when all the processing results are output to the RAM 203. If it is determined that all the processing results have not been output to the RAM 203 (NO in step S2605), all the processing results being output to the RAM 203 is waited for.

If it is determined that all the processing results have been output to the RAM 203 (YES in step S2605), the processing proceeds to step S2606.

In step S2606 the CPU 106 notifies processing completion by the FPGA circuit.

In step S2607, the CPU 106 determines whether all of the processing results stored in the RAM 203 have been obtained. If it is determined that the CPU 106 has not obtained all of the processing results stored in the RAM 203 (NO in step S2607), it continues to obtain all of the processing results. At this point the CPU 106 obtains the processing results stored in the RAM 203 via the memory controller 305 and the host IF 304. If it is determined that the CPU 106 has obtained all of the processing results stored in the RAM 203 (YES in step S2607), the processing transitions to step S2603.

[Image Processing by CPU 204]

Figure 27:
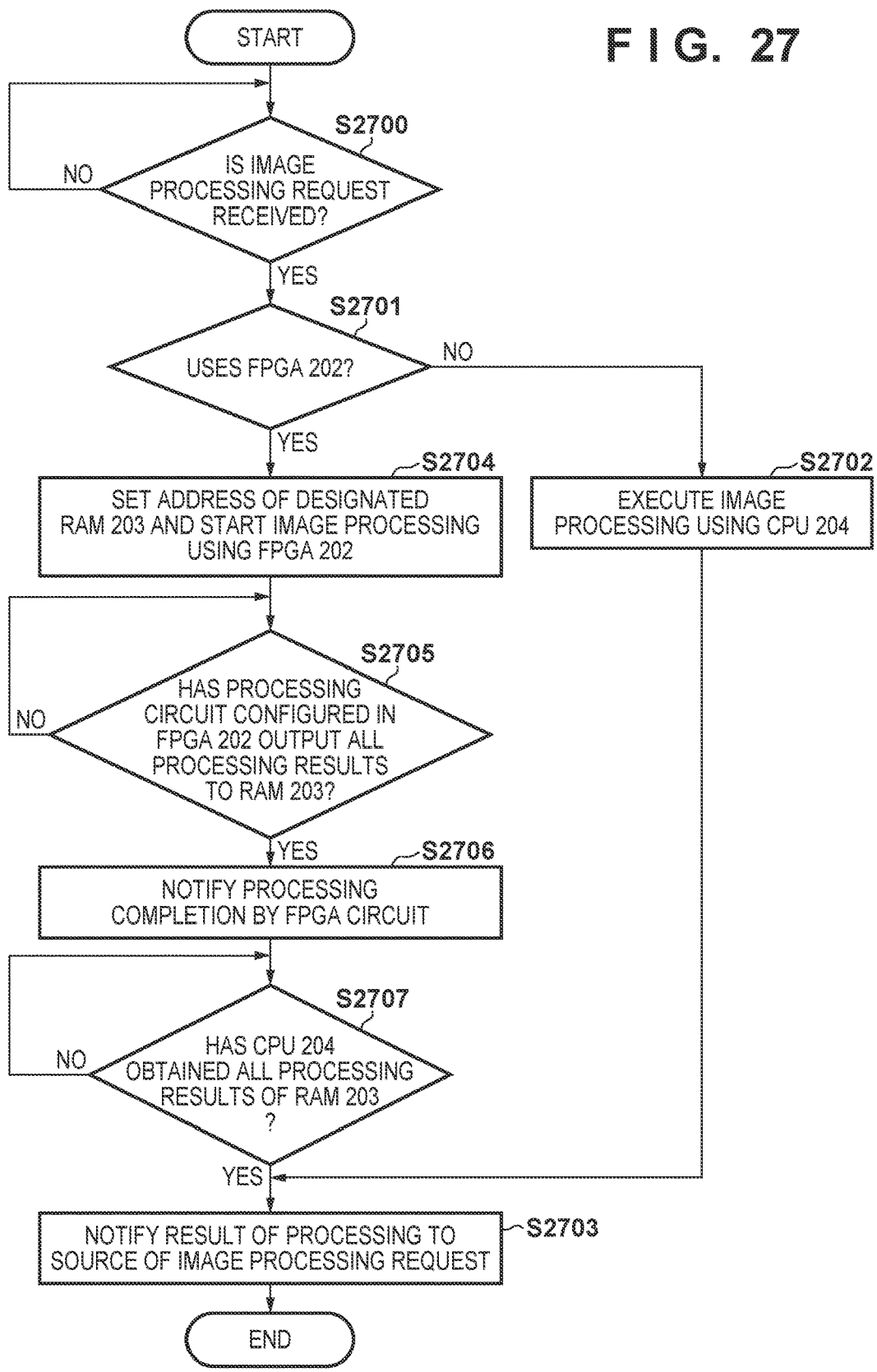
FIG. 27 is a flowchart for image processing in accordance with the fourth embodiment.

FIG. 27 is a flowchart of image processing by the CPU 204 according to the present embodiment. Each procedure of the flowchart of FIG. 27 is executed by the CPU 204 in accordance with software. In the extension processing control flow, this processing flow is started when a processing configuration that uses the CPU 204 is selected and a processing request is made to the CPU 204. A point that is different to FIG. 16 described in the first embodiment is the point that, if the selected processing configuration uses the FPGA 202, processing completion by the FPGA circuit is notified before the notification of processing termination (step S2704 to step S2707).

In step S2700, the CPU 204 determines whether or not the image processing request is received. If it is determined that an image processing request is received (YES in step S2700), the processing proceeds to the processing of step S2701, and if it is determined that the image processing request is not received (NO in step S2700), the image processing request being received is awaited.

In step S2701, the CPU 204 determines whether the processing configuration of the image processing request is a processing configuration that performs a process that uses the FPGA 202. If it is determined that the processing configuration of the image processing request is a processing configuration that does not use the FPGA 202 (NO in step S2701) the processing proceeds to step S2702, and if it is determined to be a processing configuration that uses the FPGA 202 (YES in step S2701), the processing proceeds to step S2704.

In step S2702, the CPU 204 does not use the FPGA 202 to execute image processing. Thereafter the processing proceeds to step S2703.

In step S2703, the CPU 204 performs a notification of processing termination, and notifies a result of processing to the source of the image processing request. This processing flow is then terminated.

In step S2704, with respect to the processing circuit of the FPGA 202, the CPU 204 starts image processing by initializing an address of the RAM 203 to be used, which is sent along with the image processing request from the extension processing control flow. The initialization here is performed by appropriately setting a register of the processing circuit configured in the FPGA 202. An address of the RAM 203 to be used is decided in accordance with a usage condition of the RAM 203 or an amount of data newly used. Here, the decision of the address is explained in step S2907 or step S2909 of FIG. 29.

In step S2705, the CPU 204 determines whether the processing circuit configured in the FPGA 202 has output all processing results to the RAM 203. The processing circuit configured in the FPGA 202 outputting all processing results to the RAM 203 is notified to the CPU 204 by an interrupt from the processing circuit, and thus can be detected by the CPU 204. Alternatively, the CPU 106 can also detect by polling a register, on the processing circuit, changed when all the processing results are output to the RAM 203. If it is determined that all the processing results have not been output to the RAM 203 (NO in step S2705), all the processing results being output to the RAM 203 is waited for. If it is determined that all the processing results have been output to the RAM 203 (YES in step S2705), the processing proceeds to step S2706.

In step S2706, the CPU 204 notifies processing completion by the FPGA circuit.

In step S2707, the CPU 204 determines whether all of the processing results stored in the RAM 203 have been obtained. If it is determined that the CPU 204 has not obtained all of the processing results stored in the RAM 203 (NO in step S2707), it continues to obtain all of the processing results. At this point, the CPU 204 obtains the processing results stored in the RAM 203 via the memory controller 305 and the external IF 306. If it is determined that the CPU 204 has obtained all of the processing results stored in the RAM 203 (YES in step S2707), the processing transitions to step S2703.

[Extension Processing Control]

Figure 28:
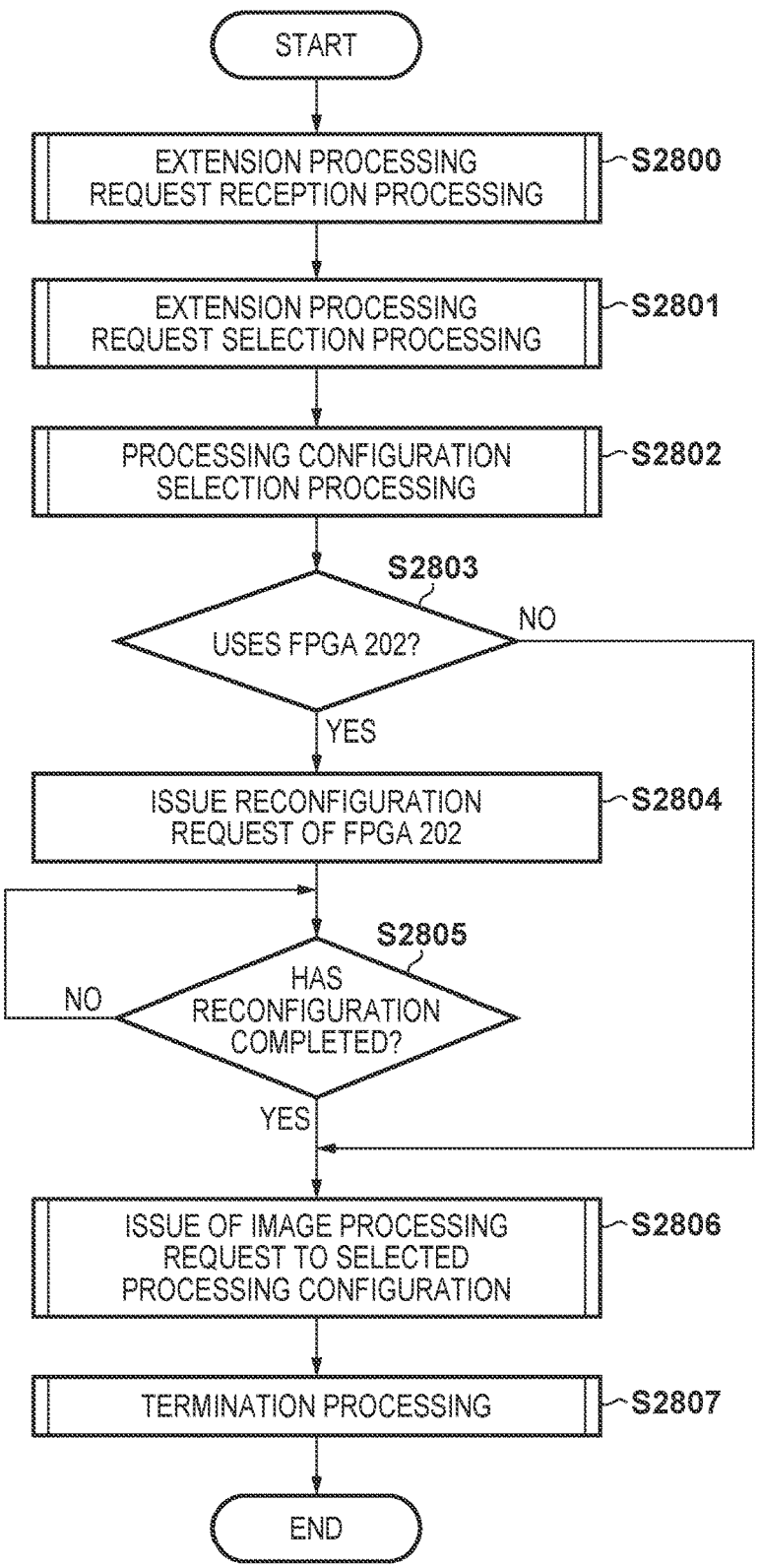
FIG. 28 is a flowchart for extension processing control processing in accordance with the fourth embodiment.

FIG. 28 is a flowchart of overall processing of extension processing control according to the present embodiment. Each procedure of the flowchart of FIG. 28 is executed by the CPU 106 in accordance with software. Points different to the flow of FIG. 9 described in the first embodiment, are processing in which the extension processing control issues an image processing request to the corresponding CPU (step S2806), and termination processing (step S2807). Note that, as will be explained later, in the termination processing (step S2807), by the processing completion notification by the FPGA circuit notified before processing termination, the column of the FPGA 202 of the processing unit availability status management table 2500 is updated to "unused". The processing configuration selection processing (step S2802) in FIG. 28, is the same as the processing flow of FIG. 12 described in the first embodiment. However, in step S1206 of FIG. 12, even if the RAM 203 is in use before a previous process performs a notification of processing termination, it is possible to select a processing configuration that uses the FPGA 202. In other words, in step S2804 of FIG. 28, even if the RAM 203 is in use before a previous process performs a notification of processing termination, it is possible to perform a reconfiguration of the FPGA 202. Here, explanation is given only of portions different to that of the first embodiment.

Figure 29:
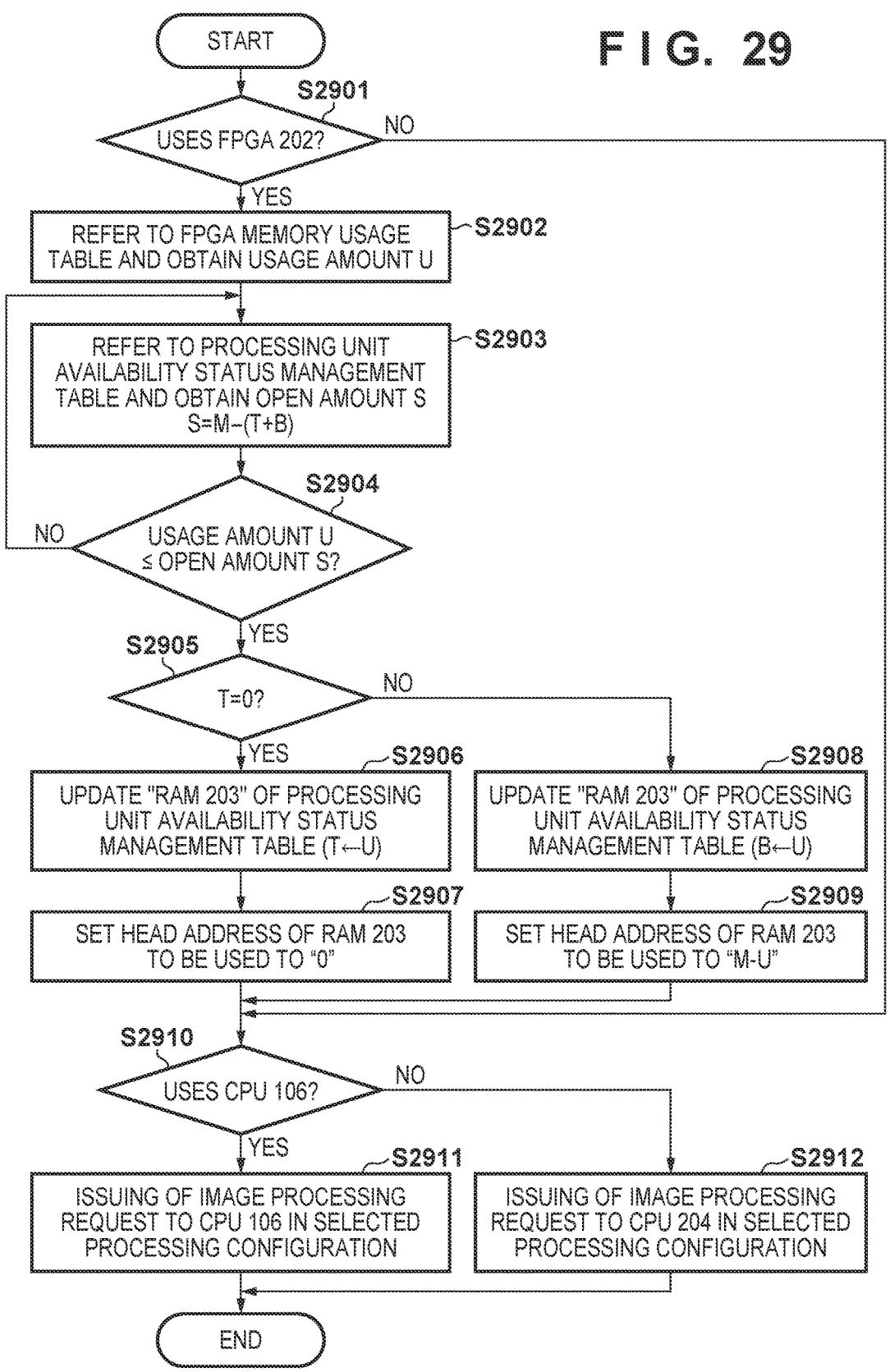
FIG. 29 is a flowchart for image processing request issuance processing in accordance with the fourth embodiment.

FIG. 29 is a flowchart that issues an image processing request according to the present embodiment. This corresponds to step S2806 of FIG. 28. Each procedure of the flowchart of FIG. 29 is executed by the CPU 106 in accordance with software. After deciding the processing configuration by the processing configuration selection processing (step S2802 of FIG. 28), if the selected processing configuration uses the FPGA 202, this processing flow is started after the processing circuit is configured in the FPGA 202. Note that a variable M used in this flowchart illustrates an overall storage capacity of the RAM 203. In addition, a variable T and a variable B used in this flowchart respectively indicate, from columns of "RAM 203" of the processing unit availability status management table 2500, a value stored in "head" and a value stored in "tail".

In step S2901, the CPU 106 determines whether the selected processing configuration is a processing configuration that uses the FPGA 202. If it is determined that the selected processing configuration is a processing configuration that does not use the FPGA 202 (NO in step S2901) the processing proceeds to step S2910, and if it is determined to be a processing configuration that uses the FPGA 202 (YES in step S2901), the processing proceeds to step S2902.

In step S2902, the CPU 106 refers to the FPGA memory usage table 2400, and, based on a process to be performed in the selected processing configuration, obtains the capacity of the RAM 203, which is needed by the processing circuit configured in the FPGA 202 for the process. Here, the obtained usage amount is the value of the variable U.

In step S2903, the CPU 106 refers to the column for "RAM 203" of the processing unit availability status management table 2500, and obtains available space of the RAM 203. Here, by subtracting the sum of a value T stored in "head" and a value B stored in "tail", of columns of "RAM 203" of the processing unit availability status management table 2500, from a total capacity M of the RAM 203, the open amount here can be obtained. The open amount obtained here is assumed to be the value of a variable S.

In step S2904, the CPU 106 compares the usage amount U of the RAM 203 obtained in step S2902 and the open amount S of the RAM 203 obtained in step S2903. If the usage amount U is larger than the open amount S (NO in step S2904), the processing returns to step S2903, and the CPU 106 once again confirms the open amount. If the usage amount U is less than or equal to the open amount S (YES in step S2904), the processing proceeds to step S2905.

In step S2905, the CPU 106 refers to the column for "RAM 203" of the processing unit availability status management table 2500, and determines whether the value T stored in "head" in the column for "RAM 203" is "0". If the value T is "0", the head portion of the RAM 203 can be determined to be not used, and if the value T is not "0", the tail portion of the RAM 203 can be determined to be not used. If the value T is "0" (YES in step S2905), the processing proceeds to step S2906, and if T is not "0" (NO in step S2905), the processing proceeds to step S2908.

In step S2906, the CPU 106 updates the value of "head" in the column for "RAM 203" of the processing unit availability status management table 2500 with the value of the usage amount U. Furthermore, in step S2907 the CPU 106 sets the head address of the RAM 203 to be used by the processing circuit configured in the FPGA 202 to "0". Thereafter the processing proceeds to step S2910.

In step S2908, the CPU 106 updates the value of "tail" in the column for "RAM 203" of the processing unit availability status management table 2500 with the value of the usage amount U. Furthermore, in step S2909, the CPU 106 sets the head address of the RAM 203 to be used by the processing circuit configured in the FPGA 202 to a value obtained by (M-U). Thereafter the processing proceeds to step S2910. Note that processing of the CPU 106 reaching step S2905 indicates that at least one of the CPU 106 or the CPU 204 is open (unused) in the processing unit availability status management table 2500. Accordingly, when step S2905 is reached, the RAM 203 is at most being used by one of the CPU 106 and the CPU 204. Accordingly, a flow that switches processing based on whether, in the "RAM 203" column of the processing unit availability status management table 2500, the value T stored in "head" is "0" or not is guaranteed to operate correctly.

In step S2910, the CPU 106 determines whether the selected processing configuration uses the CPU 106. If it is determined that the selected processing configuration is a processing configuration that uses the CPU 106 (YES in step S2910) the processing proceeds to step S2911, and if it is determined to be a processing configuration that does not use the CPU 106 (NO in step S2910), the processing proceeds to step S2912.

In step S2911, the CPU 106 issues an image processing request to the CPU 106 itself. This processing flow is then terminated.

In step S2912, the CPU 106 issues an image processing request to the CPU 204. This processing flow is then terminated.

Figure 30:
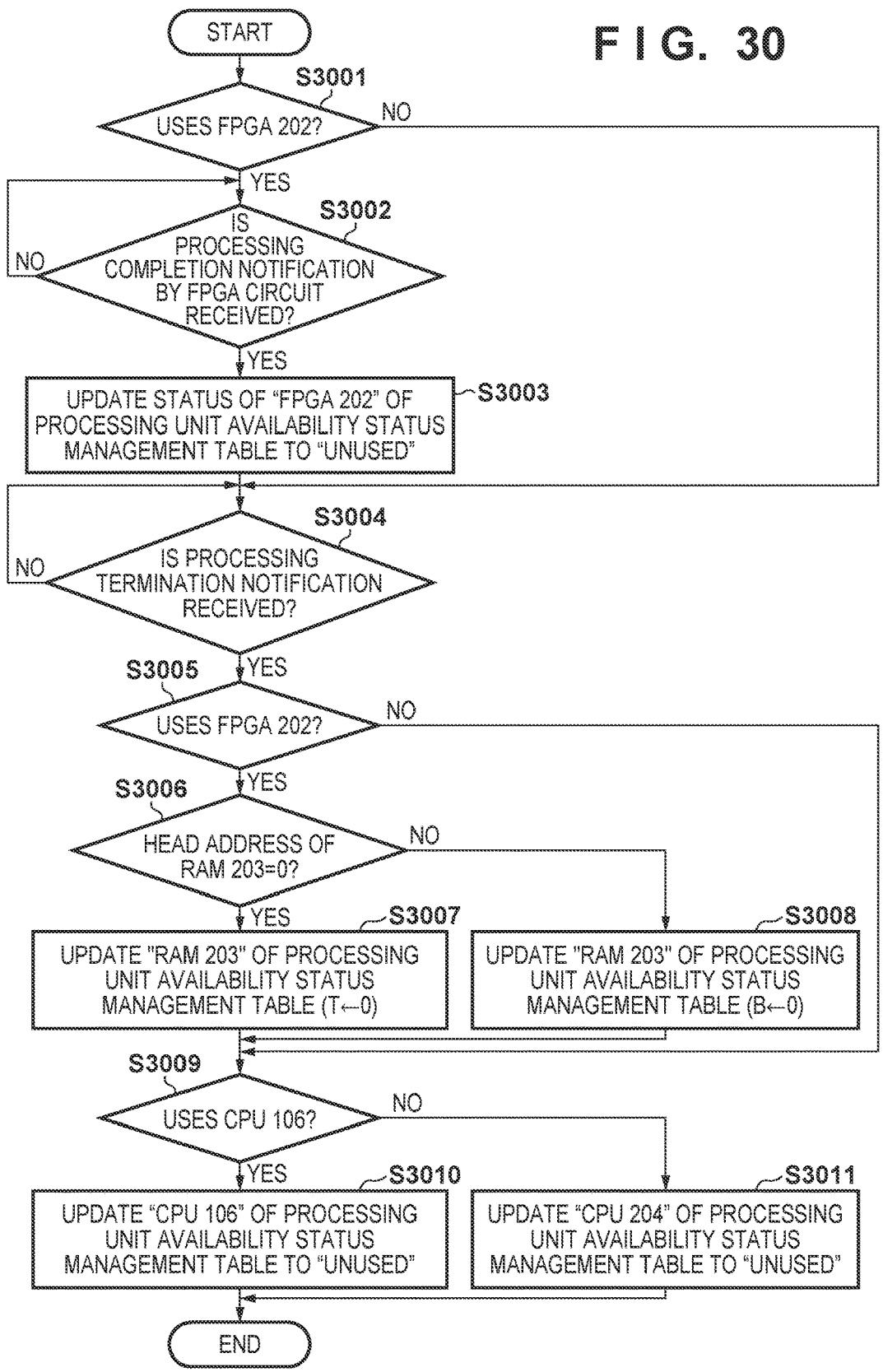
FIG. 30 is a flowchart for extension processing control termination processing in accordance with the fourth embodiment.

FIG. 30 is a flowchart of termination processing of extension processing control according to the present embodiment. Each procedure of the flowchart of FIG. 30 is executed by the CPU 106 in accordance with software. In extension processing control processing, this processing flow is started after the image processing request is issued (step S2806 of FIG. 28).

In step S3001, the CPU 106 determines whether the selected processing configuration is a processing configuration that uses the FPGA 202. If it is determined that the selected processing configuration is a processing configuration that does not use the FPGA 202 (NO in step S3001) the processing proceeds to step S3004, and if it is determined to be a processing configuration that uses the FPGA 202 (YES in step S3001), the processing proceeds to step S3002.

In step S3002, the CPU 106 determines whether a processing completion notification (step S2607 or step S2707) by the FPGA 202 and issued in image processing by the CPU 106 (FIG. 26) or image processing by the CPU 204 (FIG. 27) has been received. If it is determined that a processing completion notification by the FPGA 202 has not been received (NO in step S3002), a processing completion notification by the FPGA 202 being received is waited for, and if it is received (YES in step S3002), the processing proceeds to step S3003.

In step S3003, the CPU 106 updates the value of the column for "FPGA 202" in the processing unit availability status management table 2500 to "unused".

In step S3004, the CPU 106 determines whether a processing termination notification (step S2603 or step S2703) issued in image processing by the CPU 106 (FIG. 26) or image processing by the CPU 204 (FIG. 27) has been received. If it is determined that a processing termination notification has not been received (NO in step S3004), a processing termination notification being received is waiting for, and if received (YES in step S3004), the processing proceeds to step S3005.

In step S3005 the CPU 106 determines whether the selected processing configuration is a processing configuration that uses the FPGA 202. If it is determined that the selected processing configuration is a processing configuration that does not use the FPGA 202 (NO in step S3005) the processing proceeds to step S3009, and if it is determined to be a processing configuration that uses the FPGA 202 (YES in step S3005), the processing proceeds to step S3006.

In step S3006, the CPU 106 determines whether the head address of the RAM 203 that the FPGA 202 is to use in the selected processing configuration is "0". If the head address is "0", it can be determined that the processing circuit configured in the FPGA 202 used the head portion of the RAM 203, and if the head address is not "0", it can be determined that the processing circuit configured in the FPGA 202 used the tail portion of the RAM 203. If the head address is "0" (YES in step S3006), the processing proceeds to step S3007, and if the head address is not "0" (NO in step S3006), the processing proceeds to step S3008.

In step S3007, the CPU 106 updates the value of "head" in the column for "RAM 203" of the processing unit availability status management table 2500 with "0". Thereafter the processing proceeds to step S3009.

In step S3008, the CPU 106 updates the value of "tail" in the column for "RAM 203" of the processing unit availability status management table 2500 with "0". Thereafter the processing proceeds to step S3009.

In step S3009, the CPU 106 determines whether the selected processing configuration is a processing configuration that uses the CPU 106. If it is determined that the selected processing configuration is a processing configuration that uses the CPU 106 (YES in step S3009) the processing proceeds to step S3010, and if it is determined to be a processing configuration that does not use the CPU 106 (NO in step S3009), the processing proceeds to step S3011.

In step S3010, the CPU 106 updates the value of "CPU 106" in the processing unit availability status management table 2500 to "unused". This processing flow is then terminated.

In step S3011, the CPU 106 updates the value of "CPU 204" in the processing unit availability status management table 2500 to "unused". This processing flow is then terminated.

Thus, by virtue of the present embodiment, if the selected processing configuration uses the FPGA 202, by an FPGA circuit processing completion notification issued before a processing termination notification, reconfiguration of the FPGA 202 becomes possible. Furthermore, by adding the availability status of the RAM 203 connected to the FPGA 202 in the processing unit availability status management table 2500, if the capacity of the RAM 203 permits, after the reconfiguration of the FPGA 202, it immediately becomes possible to issue the image processing request to the corresponding CPU. With this, it is possible to cause the processing speed of the image forming apparatus to improve. In addition, in the present embodiment, the availability status of the RAM 203 connected to the FPGA 202 is added to the processing unit availability status management table 2500. Therefore, even in a case where the FPGA 202 is simultaneously used by two or more CPUs, it is possible to avoid contention of a usage area of the RAM 203, and it is possible to guarantee operation.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-016085, filed Jan. 29, 2015, which is hereby incorporated by reference herein in its entirety.

What is claimed is:

1. An information processing apparatus that processes a job, the apparatus comprising:
a programmable logic device, in which logic circuitry can be changed by executing a logic circuitry configuration, to execute an image process among a plurality of image processes;
a first processor;
a second processor;
a first storage device that stores, in association with each image process of the plurality of image processes, corresponding processing configuration information for the image process having two or more of a first processing configuration in which the logic circuitry in the programmable logic device executes the image process under control the first processor, a second processing configuration in which the logic circuitry in the programmable logic device executes the image process under control of the second processor, a third processing configuration in which the first processor executes the image process without using the programmable logic device, and a fourth processing configuration in which the second processor executes the image process without using the programmable logic device, and wherein the two or more processing configurations in each processing configuration information are prioritized; and
wherein, the first processor is configured to act as;
a receiving unit configured to receive an execution request for a first image process of the plurality of image processes;
a managing unit configured to manage state condition information regarding respective current usage condition indicating availability of each of the programmable logic device, the first processor, and the second processor to be used to execute the first image process,
a determining unit configured to select, after receiving the execution request, first processing configuration information stored in the first storage device that corresponds to the first image process, and to determine one processing configuration having a highest priority for executing the first image process, among the plurality of processing configurations in the selected first processing configuration information, that are available in view of the availability of the programmable logic device, the first processor, and the second processor based on respective priorities of the processing configurations in the first processing configuration information and the current usage condition,
an instruction unit configured to instruct the programmable, logic device to execute the logic circuitry configuration to chance the logic circuitry in the programmable, logic device for the first image process only when the determining unit determines the first processing configuration or when the determining unit determines the second processing configuration; and
a control unit configured to cause the image process to be executed in accordance with the determined processing configuration.

2. The information processing apparatus according to claim 1, wherein the programmable logic device is a FPGA, the first processor is a CPU, and the second processor is another CPU.

3. The information processing apparatus according to claim 1, wherein
in the first case where the determined processing configuration is the first processing configuration, the first processor controls the programmable logic device having been configured for the first image process to execute the first image process,
in the second case where the determined processing configuration is the second processing configuration, the first processor causes the second processor to control the programmable logic device having been configured for the first image process so as to execute the first image process,
in a third case where the determined processing configuration is the third processing configuration, the first processor executes the first image process, and
in a fourth case where the determined processing configuration is the fourth processing configuration, the first processor causes the second processor to execute the first image process,
wherein the first processor obtains image data for which the first image process has been executed in each of the first, second, third and fourth cases.

4. The information processing apparatus according to claim 1,
wherein the second storage device further stores priority setting indicating whether to execute an image process with power prioritized or with performance prioritized; and
wherein, in a case where the execution request for the first image process is received in a predetermined power saving state where power is supplied to the first processor and is not supplied to the second processor and the programmable logic device, the first processor determines the processing configuration from among the plurality of processing configurations for the image process, based on the priority setting and the usage possibility information.

5. The information processing apparatus according to claim 4,
wherein the first storage device further stores, in association with the plurality of processing configurations for the image process, usage possibility information indicating at least one processing configuration that is available in a case where the priority setting indicates power is prioritized, and
wherein, in the case where the execution request for the first image process is received in the predetermined power saving state, the first processor:
determines a processing configuration having a highest priority, among one or more of the plurality of processing configurations that are available using one or more of the programmable logic device, the first processor, and the second processor that are indicated to be available by the current usage condition, if the priority setting indicates performance is prioritized; and
determines a processing configuration having a highest priority, among one or more of the plurality of processing configurations (a) that are available using one or more of the programmable logic device, the first processor, and the second processor that are indicated to be available by the current usage and (b) that are indicated to be available by the usage possibility information, if the priority setting indicates power is prioritized.

6. The information processing apparatus according to claim 1,
wherein the information processing apparatus is operable in one of a plurality of power modes, the plurality of power modes being different from each other with regard to power consumption,
wherein the first processor determines one of the plurality of processing configurations, based on the power mode in which the information processing apparatus is operable at the time of receiving the execution request of the image process.

7. The information processing apparatus according to claim 6,
wherein the plurality of power modes include a first power mode and a second power mode where power consumption is less than the first power mode,
wherein the plurality of processing configurations are available in the first power mode, and a part of the plurality of processing configurations is available and the other part of the plurality of processing configurations is unavailable in the second power mode, and
wherein the first processor:
in a case where the execution request of the image process is received in the first power mode, determines a processing configuration having a highest priority for the image process, among one or more of the plurality of processing configurations that are available under the current usage conditions; and
in a case where the execution request of the image process is received in the second power mode, determines a processing configuration having a highest priority for the image process, among one or more of the part of plurality of processing configurations that are available under the current usage conditions.

8. An information processing apparatus comprising:
a first processor;
a second processor;
a programmable logic device in which logic circuitry can be changed by a logic circuitry configuration for use in executing an image process among a plurality of image processes;
a first storage device which stores, in association with each image process of the plurality of image processes, corresponding processing configuration information for the image process having two or more of a first processing configuration in which the image process is executed by the logic circuitry in the programmable logic device controlled by the first processor, a second processing configuration in which the image process is executed by the logic circuitry in the programmable logic device controlled by the second processor, a third processing configuration in which the image process is executed by the first processor without using the programmable logic device and the second processor, and a fourth processing configuration in which the image process is executed by the second processor without using the programmable logic device and the first processor, wherein the two or more processing configurations in each processing configuration information are prioritized; and wherein the first processor is configured to act as:
   a receiving unit configured to receive an execution request for a first image process of the plurality of image processes;
   a managing unit configured to manage state condition information about current respective usage conditions indicating availability of the first processor, the second processor, and the programmable logic device to be used to execute the first image process;
   a determining unit configured to select, after receiving the execution request, first processing configuration information stored in the first storage device that corresponds to the first image process, and to determine one processing configuration whose priority is highest among processing configurations in the selected first processing configuration information that are available in view of the availability of the first processor, the second processor, and the programmable logic device, to execute the first image process, based on respective priorities of the processing configurations in the first processing configuration information and the current usage conditions;
   an instruction unit configured to instruct the programmable logic device to execute the logic circuitry configuration to change the logic circuitry in the programmable logic device for the first image process only when the determining unit determines the first processing configuration or when the determining unit determines the second processing configuration; and
   a control unit configured to cause the first image process to be executed, according to the determined processing configuration.

9. The information processing apparatus according to claim 8, wherein the determining unit determines, as the one processing configuration for the first image process, a processing configuration having a highest priority, from one or more processing conditions, which are available using one or more of the programmable logic device, the first processor, and the second processor that are indicated to be available by the current usage conditions.

10. The information processing apparatus according to claim 8,
   wherein the determining unit determines the one processing configuration for the first image process by:
     (a) selecting a processing configuration in the first processing configuration information having a highest priority;
     (b) determining if the selected processing configuration is available based on the current usage conditions;
     (c) if the selected processing configuration is available, determining that the selected processing configuration is the processing configuration to be used to execute the first image process; else, selecting a processing configuration in the first processing configuration information having a next highest priority, and repeating steps (b) and (c).

11. The information processing apparatus according to claim 8, wherein the first processor is further configured to act as a deciding unit configured to decide the image process, among a plurality of image processes for which the receiving unit received a request, to be a processing target wherein
   the deciding unit decides the image process to be the processing target in an order in which the receiving unit received the requests for the image processes.

12. The information processing apparatus according to claim 8, wherein the first processor is further configured to act as:
   a job receiving unit configured to receive a job comprised of a plurality of processes;
   a second managing unit configured to manage, for each of received jobs, units that execute processing and processing states of each of the comprising plurality of processes; and
   a deciding unit configured to decide a process to be a processing target,
   wherein
   the receiving unit receives and registers in a queue a request for each of the plurality of processes that comprise a job, and
   the deciding unit, if a plurality of processes are registered in the queue, obtains information of a unit that is to execute subsequent processing for each of the plurality of processes registered in the queue, based on the information managed by the second managing unit, and controls an order of the processes, among the plurality of processes registered in the queue, so as to preferentially decide as a processing target a process for which the unit that performs subsequent processing is not contentious with the unit that performs subsequent processing of another registered process.

13. The information processing apparatus according to claim 8, wherein the information processing apparatus is operable in a first power mode and in a second power mode that is more power saving in comparison to the first power mode,
   power is supplied to the first processor, the second processor and the programmable logic device in the first power mode,
   power is supplied to the first processor and is not supplied to the second processor and the programmable logic device in the second power mode,
   wherein the managing unit further manages:
     a priority setting indicating whether to execute the image process of the plurality of image processes with power prioritized or with performance prioritized; and
   wherein, in a case where the receiving unit receives the execution request for the first image process in the second power mode, the determining unit determines a processing configuration, in the selected first processing configuration information to execute the first image process, based on the priority setting and the usage possibility information.

14. The information processing apparatus according to claim 13, wherein, in a case where the receiving unit receives the execution request for the first image process in the second power mode, the determining unit:
   determines a processing configuration of the two or more processing configurations, based on a priority of the processing configuration and the current usage conditions, if the priority setting indicates performance is prioritized; and determines a processing configuration of the two or more processing configurations, based on the usage possibility information and the current usage conditions, if the priority setting indicates power is prioritized.

15. The information processing apparatus according to claim 8,
wherein, in the first processing configuration, the first processor causes the programmable logic device in which the logic circuitry has changed by the logic circuitry configuration for the first image process instructed by the first processor to execute the image process,
in the second processing configuration, the second processor causes the programmable logic device in which the logic circuitry has changed by the logic circuitry configuration for the first image process instructed by the first processor to execute the image process,
in the third processing configuration, the first processor executes the first image process without using the programmable logic device, and
in the fourth processing configuration, the second processor executes the first image process without using the programmable logic device.

16. The information processing apparatus according to claim 8, wherein if the processing configuration determined by the determining unit is a processing configuration that uses the programmable logic device, the control unit,
at a time when the processing configuration is determined, causes the managing unit to manage the programmable logic device as in use, and,
regardless of whether a process by the first or the second processor included in the processing configuration determined by the determining unit has completed and at a point in time when execution of the process that uses a function reconfigured in the programmable logic device has completed, causes the managing unit to manage the programmable logic device as unused.

17. The information processing apparatus according to claim 8, wherein the first processor is further configured to act as:
a unit configured to hold information, for each type of the processes, of a usage amount of a memory necessary when a process that uses the programmable logic device is executed; and
a unit configured to manage available space of the memory,
wherein
the control unit, if a usage amount of memory of processing to be next executed using the programmable logic device is smaller than a current available space of the memory, before processing by the first or the second processor included in the processing configuration determined by the determining unit completes and at a time of completion of processing by a function configured in the programmable logic device, controls so as to start reconfiguration of a next function of the programmable logic device.

18. The information processing apparatus according to claim 17, wherein the control unit decides an address of the memory used in processing to be next executed by using the programmable logic device, in accordance with the available space of the memory.

* * * * *